(12) United States Patent
Kim et al.

(10) Patent No.: US 11,837,621 B2
(45) Date of Patent: Dec. 5, 2023

(54) IMAGE SENSOR INCLUDING A SEMICONDUCTOR PATTERN

(71) Applicant: SAMSUNG ELECTRONICS CO., LTD., Suwon-si (KR)

(72) Inventors: Kook Tae Kim, Hwaseong-si (KR); Ju-Eun Kim, Hwaseong-si (KR); Miseon Park, Hwaseong-si (KR); Jaewoong Lee, Hwaseong-si (KR); Soojin Hong, Guri-si (KR)

(73) Assignee: SAMSUNG ELECTRONICS CO., LTD., Suwon-si (KR)

(*) Notice: Subject to any disclaimer, the term of this patent is extended or adjusted under 35 U.S.C. 154(b) by 282 days.

(21) Appl. No.: 17/182,364

(22) Filed: Feb. 23, 2021

(65) Prior Publication Data
US 2022/0013566 A1 Jan. 13, 2022

(30) Foreign Application Priority Data
Jul. 7, 2020 (KR) ........................ 10-2020-0083601

(51) Int. Cl.
*H01L 27/146* (2006.01)

(52) U.S. Cl.
CPC .... *H01L 27/14636* (2013.01); *H01L 27/1463* (2013.01); *H01L 27/14621* (2013.01)

(58) Field of Classification Search
CPC .......... H01L 27/14636; H01L 27/1463; H01L 27/14621; H01L 27/14612; H01L 27/14627; H01L 27/1464; H01L 27/14607
See application file for complete search history.

(56) References Cited

U.S. PATENT DOCUMENTS

| | | | |
|---|---|---|---|
| 8,664,578 B2 | 3/2014 | Hirigoyen et al. | |
| 8,964,081 B2 | 2/2015 | Ohkubo et al. | |
| 9,054,007 B2 | 6/2015 | Hu et al. | |
| 9,923,009 B1 * | 3/2018 | Hsiung | H01L 27/14685 |

(Continued)

FOREIGN PATENT DOCUMENTS

| KR | 10-2020-0052126 | 5/2020 |
|---|---|---|
| KR | 10-2020-0087544 | 7/2020 |

*Primary Examiner* — Kimberly N Rizkallah
*Assistant Examiner* — Pratiksha Jayant Lohakare
(74) *Attorney, Agent, or Firm* — F. Chau & Associates, LLC

(57) ABSTRACT

An image sensor including a substrate having first and second surfaces that are opposite to each other. The substrate includes unit pixel regions having photoelectric conversion regions. A semiconductor pattern is disposed in a first trench defined in the substrate and defines the unit pixel regions. The semiconductor pattern includes a first semiconductor pattern and a second semiconductor pattern disposed on the first semiconductor pattern. A back-side insulating layer covers the second surface of the substrate. The first semiconductor pattern includes a side portion extended along an inner side surface of the first trench and a bottom portion connected to the side portion and disposed closer to the second surface of the substrate than the side portion. The second semiconductor pattern extends toward the second surface of the substrate and is spaced apart from the back-side insulating layer with the bottom portion of the first semiconductor pattern interposed therebetween.

20 Claims, 21 Drawing Sheets

(56) References Cited

U.S. PATENT DOCUMENTS

| | | | |
|---|---|---|---|
| 2009/0302409 A1* | 12/2009 | Qian | H01L 27/14629 257/E31.001 |
| 2012/0104529 A1* | 5/2012 | Tanaka | C09B 67/0033 430/7 |
| 2014/0038337 A1* | 2/2014 | Pyo | H01L 23/481 438/65 |
| 2014/0054662 A1* | 2/2014 | Yanagita | H01L 27/1462 438/73 |
| 2014/0132812 A1* | 5/2014 | Soda | H01L 27/1464 257/432 |
| 2014/0264687 A1* | 9/2014 | Hsieh | H01L 27/14685 257/432 |
| 2015/0028405 A1* | 1/2015 | Minami | H01L 27/1463 257/432 |
| 2015/0279878 A1* | 10/2015 | Ahmed | H01L 27/14685 257/446 |
| 2016/0204085 A1* | 7/2016 | Sekar | H01L 21/823475 257/621 |
| 2016/0343751 A1* | 11/2016 | Sze | H01L 27/14621 |
| 2017/0077157 A1* | 3/2017 | Cheng | H01L 27/14621 |
| 2017/0294470 A1* | 10/2017 | Takami | H01L 27/14629 |
| 2018/0090536 A1* | 3/2018 | Mandai | H01L 27/14643 |
| 2019/0214419 A9* | 7/2019 | Tayanaka | H01L 27/14627 |
| 2020/0119072 A1* | 4/2020 | Lim | H01L 27/1462 |
| 2020/0144316 A1 | 5/2020 | Kim et al. | |
| 2020/0227449 A1 | 7/2020 | Kim et al. | |
| 2021/0082974 A1* | 3/2021 | Uchida | H01L 27/14614 |
| 2021/0351218 A1* | 11/2021 | Kuo | H01L 27/1463 |
| 2021/0366967 A1* | 11/2021 | Cheng | H01L 27/14689 |
| 2021/0366969 A1* | 11/2021 | Bak | H01L 27/14645 |
| 2022/0359584 A1* | 11/2022 | Hamasaki | G01S 17/894 |

* cited by examiner ic conversion regions. A device isolation pattern is disposed adjacent to the first surface of the substrate. A pixel isolation pattern is configured to define the unit pixel regions. The pixel isolation pattern penetrates the device isolation pattern and fills a first trench of the substrate. A back-side insulating layer covers the second surface of the substrate. The pixel isolation pattern includes a first insulating layer covering an inner surface of the first trench, a first semiconductor pattern, and a second semiconductor pattern penetrating the first semiconductor pattern and directly contacting the back-side insulating layer. The first semiconductor pattern and the second semiconductor pattern include poly silicon containing an impurity. A height of the first semiconductor pattern from the second surface is larger than a height of the second semiconductor pattern from the second surface.

IMAGE SENSOR INCLUDING A SEMICONDUCTOR PATTERN

CROSS-REFERENCE TO RELATED APPLICATIONS

This application claims priority under 35 U.S.C. § 119 to Korean Patent Application No. 10-2020-0083601, filed on Jul. 7, 2020 in the Korean Intellectual Property Office, the disclosure of which is incorporated by reference in its entirety herein.

1. Technical Field

The present inventive concepts relate to an image sensor, and in particular, to a complementary metal-oxide-semiconductor (CMOS) image sensor.

2. Discussion of Related Art

An image sensor is a device that converts optical signals into electrical signals. As the computer and communication industries has developed, there is an increased demand for high-performance image sensors in a variety of applications such as digital cameras, camcorders, personal communication systems, gaming machines, security cameras, microcameras for medical applications, and/or robots.

Image sensors are generally classified into charge coupled device (CCD) and complementary metal-oxide semiconductor (CMOS) image sensors. It is possible to reduce a size of a product having CMOS image sensors since CMOS image sensors may be operated by a relatively simple operation method and signal-processing circuits of the CMOS image sensor may be integrated on a single chip. In addition, since the CMOS image sensor has a relatively low power consumption, the CMOS image sensor may be easily applied to an electronic device with a limited battery capacity. Furthermore, the CMOS image sensor may be fabricated using CMOS fabrication techniques, and thus, it is possible to reduce a manufacturing cost thereof. Additionally, the use of CMOS image sensors is rapidly increasing as a high-resolution CMOS image sensor is realized.

SUMMARY

An embodiment of the present inventive concepts provides an image sensor with increased reliability.

According to an embodiment of the present inventive concepts, an image sensor may include a substrate having a first surface and a second surface that are opposite to each other. The substrate includes unit pixel regions having photoelectric conversion regions. A semiconductor pattern is disposed in a first trench defined in the substrate. The semiconductor pattern is configured to define the unit pixel regions of the substrate. The semiconductor pattern includes a first semiconductor pattern and a second semiconductor pattern disposed on the first semiconductor pattern. A back-side insulating layer covers the second surface of the substrate. The first semiconductor pattern includes a side portion extended along an inner side surface of the first trench and a bottom portion connected to the side portion and disposed to be closer to the second surface of the substrate than the side portion. The second semiconductor pattern extends toward the second surface of the substrate and is vertically spaced apart from the back-side insulating layer with the bottom portion of the first semiconductor patient interposed therebetween.

According to an embodiment of the present inventive concepts, an image sensor includes a substrate having a first surface and a second surface that are opposite to each other. The substrate includes unit pixel regions having photoelectric conversion regions. A device isolation pattern is disposed adjacent to the first surface of the substrate. A pixel isolation pattern is configured to define the unit pixel regions. The pixel isolation pattern penetrates the device isolation pattern and fills a first trench of the substrate. A back-side insulating layer covers the second surface of the substrate. The pixel isolation pattern includes a first insulating layer covering an inner surface of the first trench, a first semiconductor pattern, and a second semiconductor pattern penetrating the first semiconductor pattern and directly contacting the back-side insulating layer. The first semiconductor pattern and the second semiconductor pattern include poly silicon containing an impurity. A height of the first semiconductor pattern from the second surface is larger than a height of the second semiconductor pattern from the second surface.

According to an embodiment of the present inventive concepts, an image sensor, includes a substrate having a first surface and a second surface that are opposite to each other. The substrate includes a pixel array region, an optical black region, and a pad region. The pixel array region includes unit pixel regions having photoelectric conversion regions. A pixel isolation pattern and a device isolation pattern are disposed in the substrate. The pixel isolation patient includes a first insulating layer, a first semiconductor pattern, a second semiconductor pattern, and a capping pattern. An interconnection layer is disposed on the first surface of the substrate. The interconnection layer includes insulating layers covering the first surface of the substrate and interconnection lines disposed in the insulating layers. Transistors are disposed on the first surface of the substrate. A back-side insulating layer covers the second surface of the substrate and a bottom surface of the pixel isolation pattern. Color filters and micro lenses are disposed on a lower insulating layer. A light-blocking pattern is disposed on the second surface of the substrate and a first pad terminal is connected to the first semiconductor pattern in the optical black region. Second pad terminals are disposed on the pad region. The second semiconductor pattern is spaced apart from the back-side insulating layer with the first semiconductor pattern interposed therebetween.

DETAILED DESCRIPTION OF EMBODIMENTS

Embodiments of the present inventive concepts will now be described more fully with reference to the accompanying drawings, in which embodiments are shown.

Figure 1:
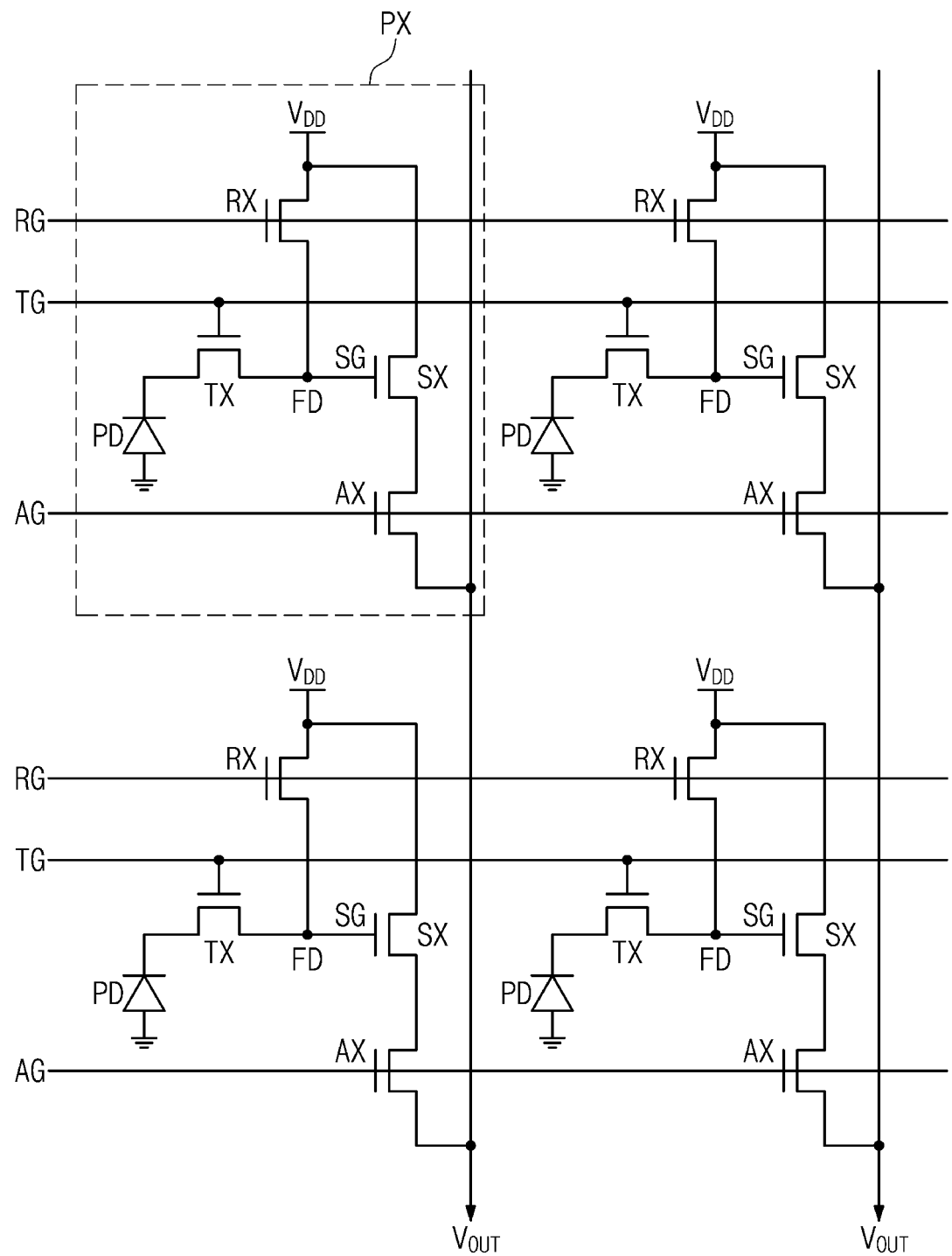
FIG. 1 is a circuit diagram illustrating an image sensor according to an embodiment of the present inventive concepts.

FIG. 1 is a circuit diagram of an image sensor according to an embodiment of the present inventive concepts.

Referring to FIG. 1, each of unit pixel regions PX of an image sensor may include a photoelectric conversion region PD, a transfer transistor TX, a source-follower transistor SX, a reset transistor RX, and a selection transistor AX. The embodiment of FIG. 1 shows four unit pixel regions PX of an image sensor. However the numbers of the unit pixel regions PX of an image sensor may vary. Each of the transfer transistor TX, the source-follower transistor SX, the reset transistor RX, and the selection transistor AX may include a transfer gate TG, a source-follower gate SG, a reset gate RG, and a selection gate AG.

In an embodiment, the photoelectric conversion region PD may be a photodiode including an n-type impurity region and a p-type impurity region. A floating diffusion region FD may be used as a drain electrode of the transfer transistor TX. The floating diffusion region FD may be used as a source electrode of the reset transistor RX. The floating diffusion region FD may be electrically connected to the source-follower gate SG of the source-follower transistor SX. The source-follower transistor SX may be electrically connected to the selection transistor AX.

Hereinafter, an operation of the image sensor will be described with reference to the embodiment of FIG. 1. In a light-blocking state, electric charges may be discharged from the floating diffusion region FD by applying a power voltage $V_{DD}$ to drain electrodes of the reset and source-follower transistors RX and SX and turning on the reset transistor RX. The reset transistor RX may then be turned off, and electron-hole pairs may be produced in the photoelectric conversion region PD by an external light incident from the outside. The holes may be moved to and accumulated in the p-type impurity region of the photoelectric conversion region PD, and the electrons may be moved to and accumulated in the n-type impurity region of the photoelectric conversion region PD. In this state, if the transfer transistor TX is turned on, the electric charges, such as electrons and holes, may be transferred to and accumulated in the floating diffusion region FD. A change in amount of the accumulated electric charges may lead to a change in gate bias of the source-follower transistor SX, and this may lead to a change in source potential of the source-follower transistor SX. In this state, if the selection transistor AX is turned on, a signal corresponding to the amount of the electric charges may be output through a column line.

In an embodiment, a routing line may be electrically connected to at least one of the transfer gate TG, the source-follower gate SG, the reset gate RG and the selection gate AG. The routing line may be configured to apply the power voltage $V_{DD}$ to the drain electrode of the reset transistor RX or the drain electrode of the source-follower transistor SX. The routing line may include the column line connected to the selection transistor AX. In an embodiment, the routing line may be one of interconnection lines, which will be described below.

FIG. 1 illustrates an example of a pixel which includes one photoelectric conversion region PD and four transistors TX RX, AX, and SX. However, embodiments of the present inventive concepts are not limited thereto. For example, in another embodiment, the image sensor may include a plurality of pixels, and the reset transistor RX, the source-follower transistor SX, or the selection transistor AX may be shared by adjacent pixels of the plurality of pixels. In this embodiment, it may be possible to increase an integration density of the image sensor.

Figure 2:
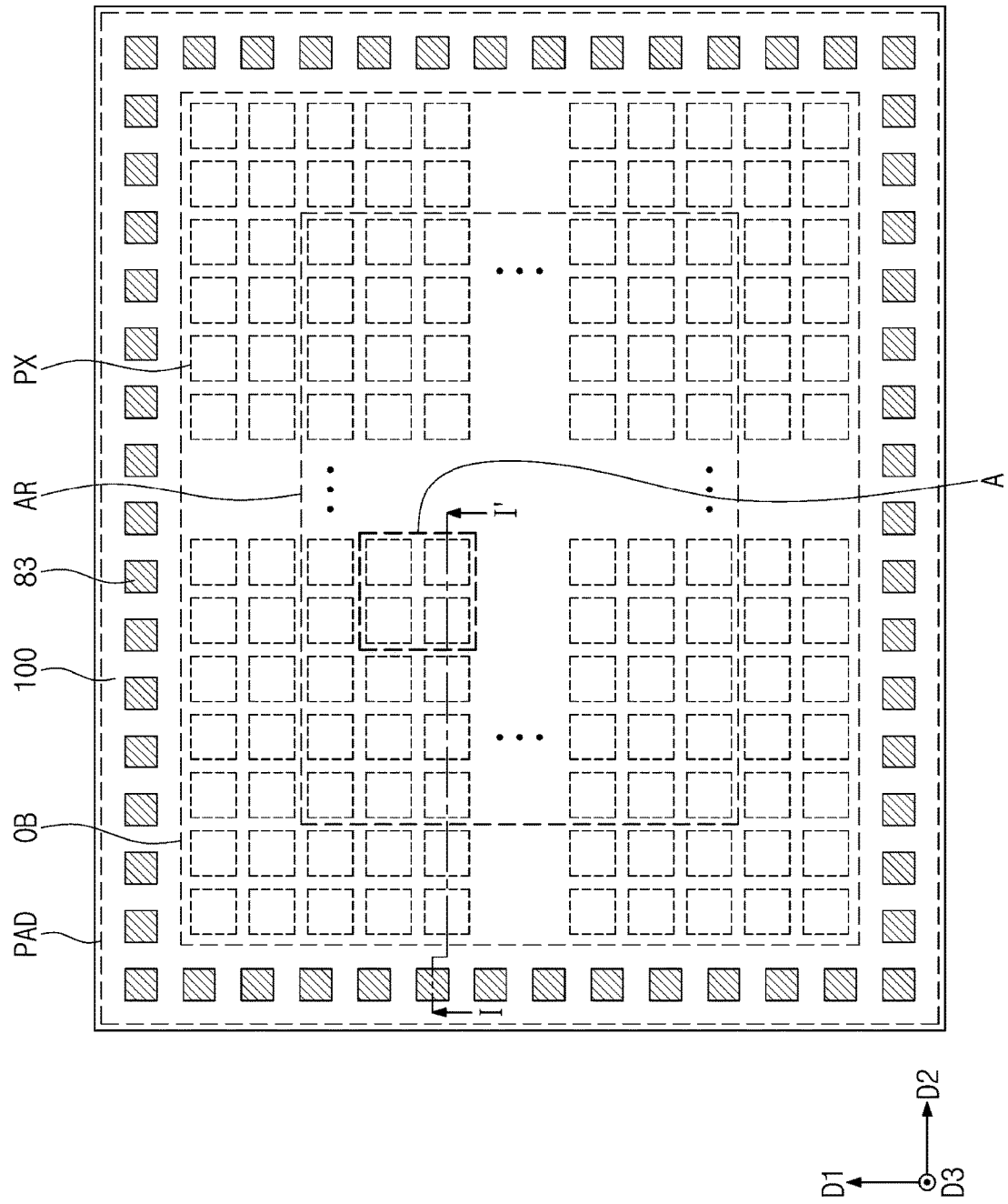
FIG. 2 is a plan view illustrating an image sensor according to an embodiment of the present inventive concepts.
Figure 3:
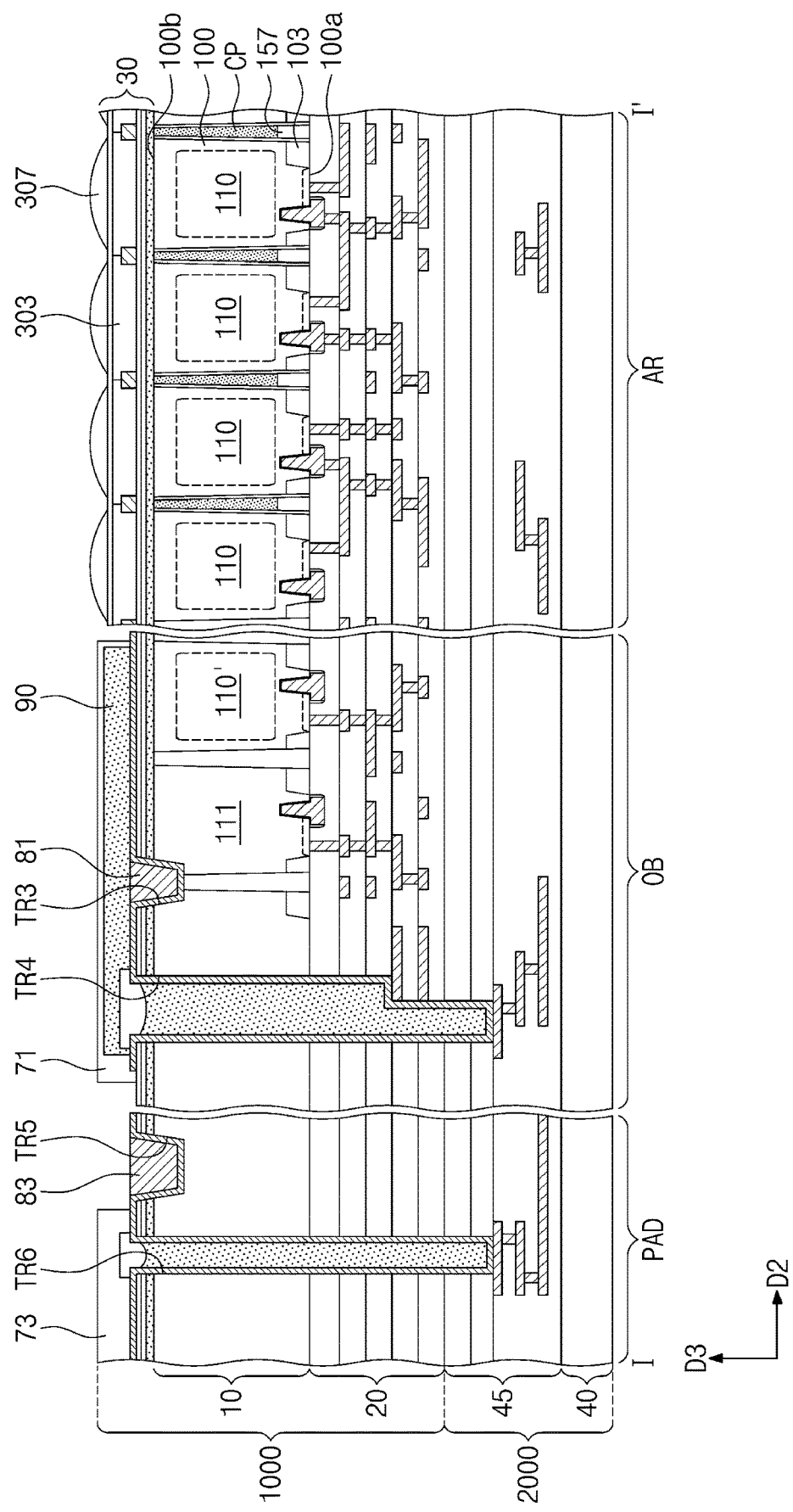
FIG. 3 is a cross-sectional view of an image sensor taken along line I-I' of FIG. 2 according to an embodiment of the present inventive concepts.

FIG. 2 is a plan view illustrating an image sensor according to an embodiment of the present inventive concepts. FIG. 3 is a cross-sectional view taken along a line I-I' of FIG. 2 according to an embodiment of the present inventive concepts.

Referring to the embodiments of FIGS. 2 and 3, an image sensor may include a sensor chip 1000 and a logic chip 2000. The sensor chip 1000 may include a photoelectric conversion layer 10, a first interconnection layer 20, and an optically-transparent layer 30. The photoelectric conversion layer 10 may include a first substrate 100, a pixel isolation pattern 150 (FIG. 5), a device isolation pattern 103, and a plurality of photoelectric conversion regions 110 disposed in the first substrate 100. The photoelectric conversion regions 110 may convert light, which is incident from the outside, to electrical signals.

The first substrate 100 may include a pixel array region AR, an optical black region OB, and a pad region PAD, when viewed in a plan view, such as in a plane defined in a first direction D1 and a second direction D2 which are both parallel to a first surface 100a of the first substrate 100 and which intersect each other. For example, the first and second directions D1, D2 may be perpendicular to each other. However, embodiments of the present inventive concepts are not limited thereto. As shown in the embodiment of FIG. 2, the pixel array region AR may be disposed in a center region of the first substrate 100, when viewed in a plan view. The pixel array region AR may include a plurality of the unit pixel regions PX. Each of the unit pixel regions PX may be configured to convert an incident light to a photoelectric signal. The unit pixel regions PX may be two-dimensionally arranged to form a plurality of columns extending substantially in the first direction D1 and a plurality of rows extending substantially in the second direction D2. A third direction D3 may be substantially perpendicular to the first surface 100a of the first substrate 100 and intersects the first and second directions D1, D2.

As shown in the embodiment of FIG. 2, when viewed in a plan view, the pad region PAD may be disposed in an edge region of the first substrate 100 (e.g., lateral edges in the first and second directions D1, D2) to enclose the pixel array region AR. Second pad terminals 83 may be disposed on the pad region PAD. An electrical signal, which is produced in the unit pixel regions PX, may be output to the outside through the second pad terminals 83. In addition, an electrical signal or voltage from the outside may be transmitted to the unit pixel regions PX through the second pad terminals 83. Since the pad region PAD is disposed in the edge region of the first substrate 100, the second pad terminals 83 may be easily coupled to the outside.

The optical black region OB may be disposed between the pixel array region AR and the pad region PAD of the first substrate 100. The optical black region OB may be disposed to enclose the pixel array region AR (e.g., in the first and second directions D1, D2), when viewed in a plan view. The optical black region OB may include a plurality of dummy regions 111. Signals that are produced in the dummy region 111 may be used to remove a process noise. Hereinafter, the pixel array region AR of the image sensor will be described in more detail with reference to the embodiments of FIGS. 4 to 6.

Figure 4:
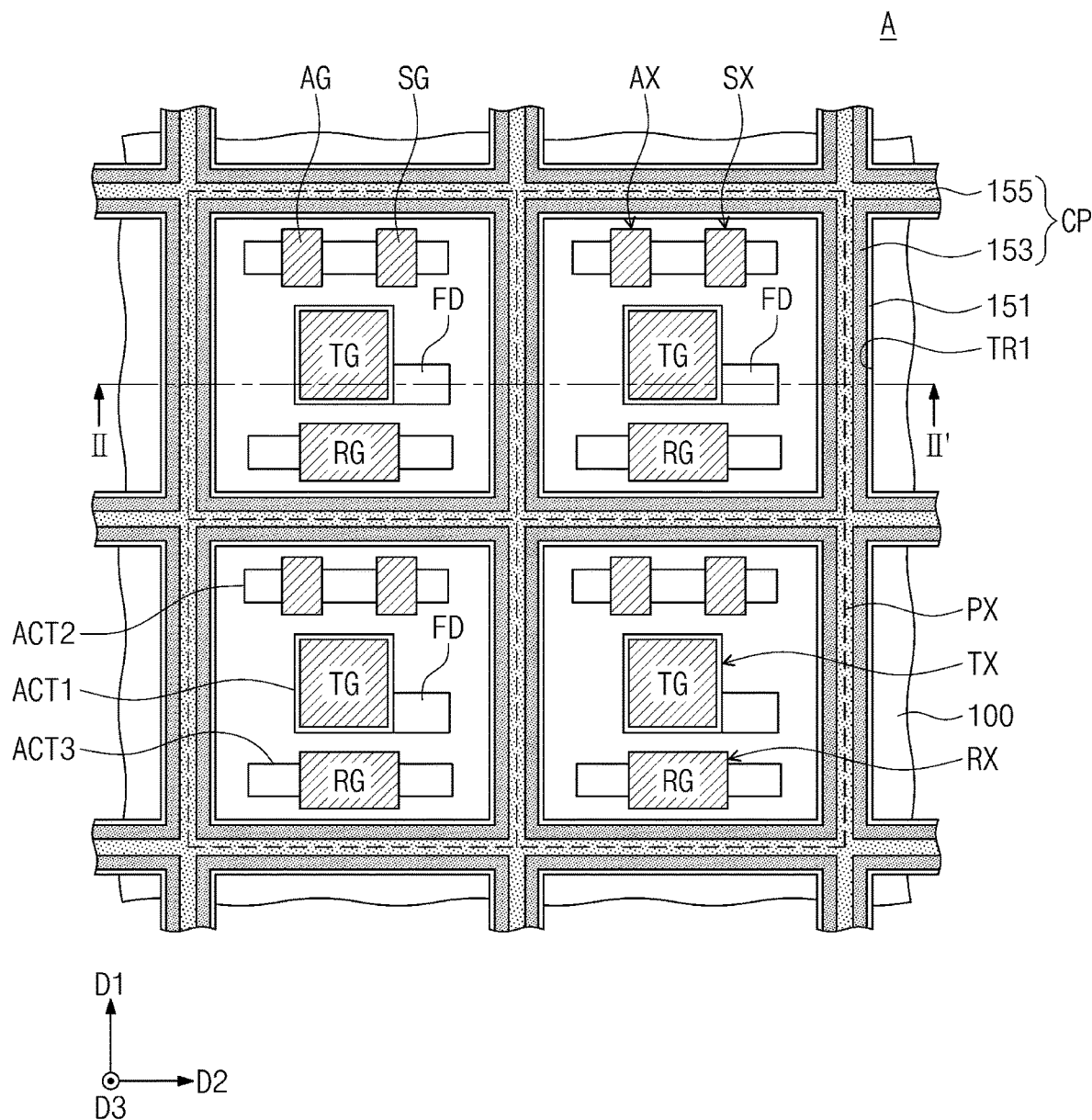
FIG. 4 is a plan view of an image sensor illustrating an enlarged shape of region A of FIG. 2 according to an embodiment of the present inventive concepts.
Figure 5:
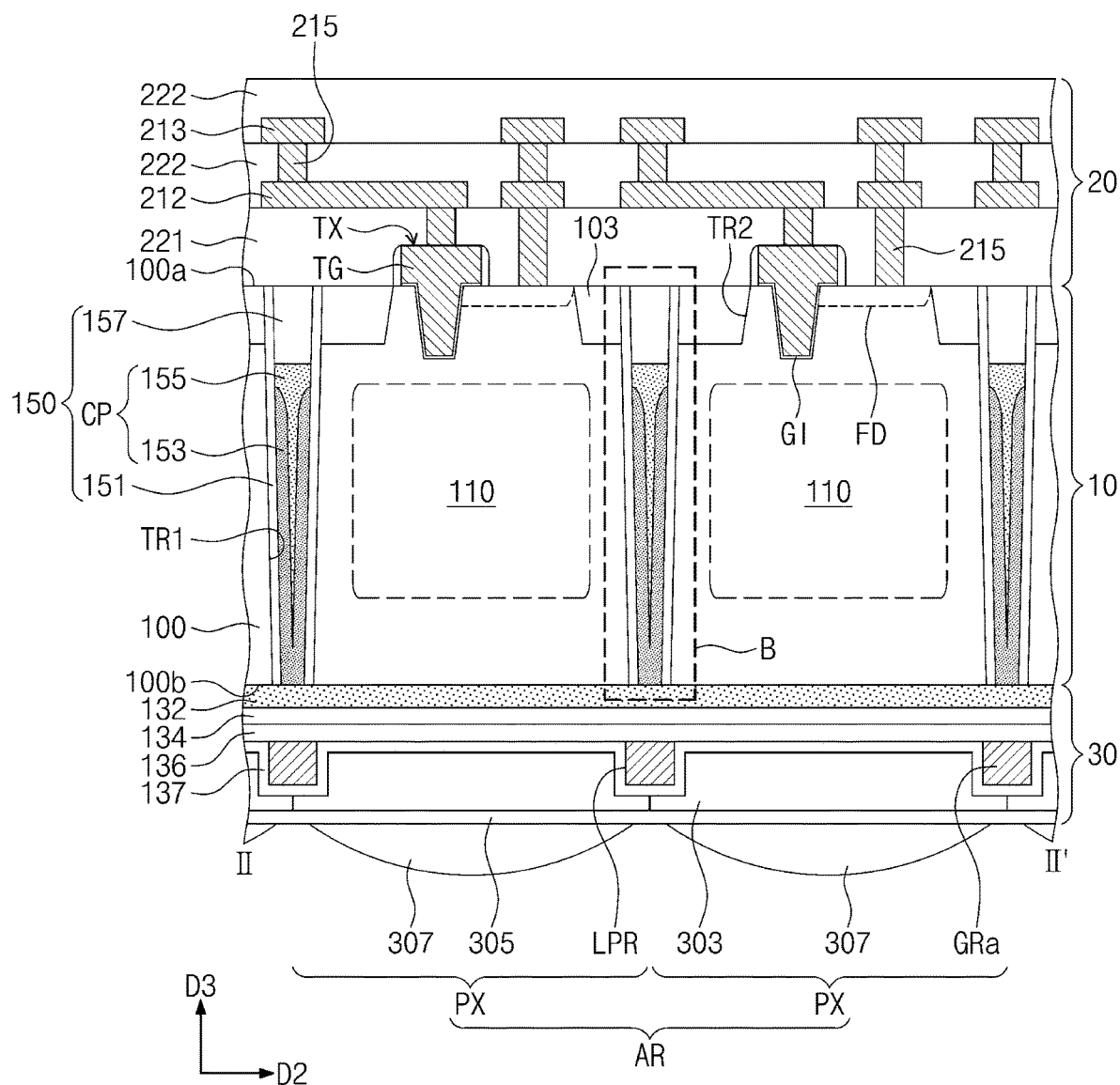
FIG. 5 is a cross-sectional view of an image sensor taken along line II-II' of FIG. 4 according to an embodiment of the present inventive concepts.
Figure 6:
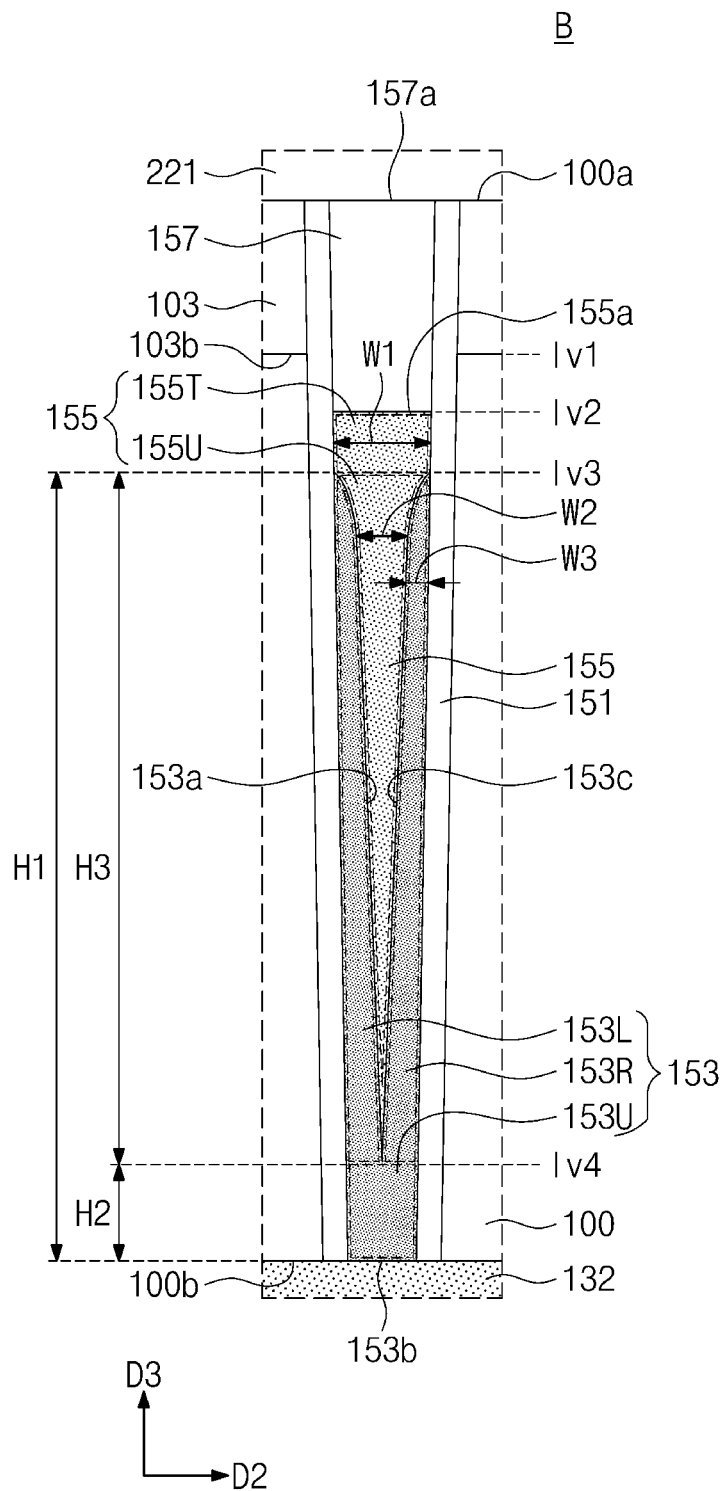
FIG. 6 is a cross-sectional view of an image sensor illustrating an enlarged shape of a region B of FIG. 5 according to an embodiment of the present inventive concepts.

FIG. 4 is a plan view illustrating an enlarged shape of a region A of FIG. 2. FIG. 5 is a cross-sectional view taken along a line II-II' of FIG. 4. FIG. 6 is a cross-sectional view illustrating an enlarged shape of a region B of FIG. 5.

Referring to FIGS. 4 to 6, an image sensor according to embodiments of the present inventive concepts may include the photoelectric conversion layer 10, the transfer gate TG, the source-follower gate SG, the reset gate RG, and the selection gate AG, the first interconnection layer 20, and the optically-transparent layer 30. The photoelectric conversion layer 10 may include the first substrate 100, the pixel isolation pattern 150, and the device isolation pattern 103.

The first substrate 100 may have a first or front surface 100a and a second or rear surface 100b, which are opposite to each other. In an embodiment, light (e.g., external light) may be incident into the second surface 100b of the first substrate 100. The first interconnection layer 20 may be disposed on the first surface 100a of the first substrate 100. For example, as shown in the embodiment of FIG. 5, a lower surface of the first interconnection layer 20 may directly contact the first surface 100a of the first substrate 100. The optically-transparent layer 30 may be disposed on the second surface 100b of the first substrate 100. For example, as shown in the embodiment of FIG. 6, an upper surface of the optically-transparent layer 30 may directly contact the second surface 100b of the first substrate 100. In an embodiment, the first substrate 100 may be a semiconductor substrate or a silicon-on-insulator (SOI) substrate. The semiconductor substrate may include, for example, a silicon substrate, a germanium substrate, or a silicon-germanium substrate. The first substrate 100 may contain impurities of a first conductivity type. For example, in an embodiment, the impurities of the first conductivity type may include p-type impurities, such as at least one selected from aluminum (Al), boron (B), indium (In), and gallium (Ga)).

The first substrate 100 may include the unit pixel regions PX defined by the pixel isolation pattern 150. In an embodiment, the unit pixel regions PX may be arranged in two different directions (e.g., the first and second directions D1 and D2) or in a matrix shape. The first substrate 100 may include the photoelectric conversion regions 110. The photoelectric conversion regions 110 may be respectively disposed in the unit pixel regions PX of the first substrate 100. The photoelectric conversion regions 110 may be configured to have the same function and role as the photoelectric conversion region PD of FIG. 1. The photoelectric conversion regions 110 may be regions of the first substrate 100 doped with impurities of a second conductivity type. The first and second conductivity types may be different from each other. For example, in an embodiment, the impurities of the second conductivity type may include n-type impurities, such as at least one selected from phosphorus, arsenic, bismuth, and/or antimony. The photoelectric conversion regions 110 may be adjacent to the first surface 100a of the first substrate 100 (e.g., in the third direction D3). For example, the photoelectric conversion regions 110 may be formed to be closer (e.g., in the third direction D3) to the first surface 100a than to the second surface 100b. As an example, each of the photoelectric conversion regions 110 may include a first region adjacent to the first surface 100a and a second region adjacent to the second surface 100b. The first and second regions of the photoelectric conversion region 110 may be different from each other in terms of respective impurity concentrations. Thus, the photoelectric conversion region NO may have a non-vanishing potential gradient between the first and second surfaces 100a and 100b of the first substrate 100. Alternatively, the photoelectric conversion region 110 may be provided to have no potential gradient between the first and second surfaces 100a and 100b of the first substrate 100.

The first substrate 100 and the photoelectric conversion region 110 may constitute a photodiode. For example, since the first conductivity type of the first substrate 100 is different from the second conductivity type of the photoelectric conversion region 110, the first substrate 100 and the photoelectric conversion region 110 may constitute a p-n junction serving as the photodiode. An amount of photocharges, which are produced and accumulated in the photoelectric conversion region 110 or the photodiode, may be in proportion to an intensity of an incident light.

As shown in the embodiment of FIG. 5, the pixel isolation pattern 150 may be disposed in the first substrate 100 to define the unit pixel regions PX. For example, the pixel isolation pattern 150 may be disposed between the unit pixel regions PX of the first substrate 100. When viewed in a plan view (e.g., in a plane defined in the first and second directions D1, D2), the pixel isolation pattern 150 may have a lattice or grid structure. When viewed in a plan view, the pixel isolation pattern 150 may enclose each of the unit pixel regions PX (e.g., in the first and second directions D1, D2). The pixel isolation pattern 150 may be disposed in a first trench TR1, and the first trench TR1 may be recessed from the first surface 100a of the first substrate 100. The pixel isolation pattern 150 may extend longitudinally (e.g., substantially in the third direction D3) from the first surface 100a of the first substrate 100 towards the second surface 100b. In an embodiment, the pixel isolation pattern 150 may be a deep trench isolation layer. The pixel isolation pattern 150 may penetrate the first substrate 100. In an embodiment, a vertical height of the pixel isolation pattern 150 may be substantially equal to a vertical thickness of the first substrate 100. As shown in the embodiment of FIG. 5, a width of the pixel isolation pattern 150 (e.g., length in the second direction D2) may gradually decrease in a direction from the first surface 100a of the first substrate 100 towards the second surface 100b. The pixel isolation pattern 150 will be described in more detail below.

The device isolation pattern 103 may be disposed in the first substrate 100. For example, the device isolation pattern 103 may be disposed in a second trench TR2, that is recessed from the first surface 100a of the first substrate 100. In an embodiment, the device isolation pattern 103 may be a shallow trench isolation layer. The device isolation pattern 103 may define first active patterns ACT1, second active patterns ACT2, and third active patterns ACT3. A bottom surface of the device isolation pattern 103 may be disposed in the first substrate 100. As shown in the embodiment of FIG. 6, a level of the bottom surface of the device isolation pattern 103 may be a first level lv1. A width of the device isolation pattern 103 (e.g., length in the second direction D2) may have a decreasing width in a direction from the first surface 100a of the first substrate 100 towards the second surface 100b. The bottom surface of the device isolation pattern 103 may be vertically spaced apart from the photoelectric conversion regions 110. For example, the bottom surface of the device isolation pattern 103 may be disposed above the photoelectric conversion regions 110 and may be spaced apart therefrom in the third direction D3. The pixel isolation pattern 150 may be overlapped with a portion of the device isolation pattern 103. For example, at least a partial portion of the device isolation pattern 103 may be disposed on and connected to an upper lateral side surface of the pixel isolation pattern 150. The lateral side and bottom surfaces of the device isolation pattern 103 and the lateral side surface of the pixel isolation pattern 150 may form a stepwise structure. A depth of the device isolation pattern 103 may be smaller than a depth of the pixel isolation pattern 150. In an embodiment, the device isolation patient 103 may be formed of or include at least one compound selected from silicon oxide, silicon nitride and silicon oxynitride.

Each of the unit pixel regions PX may include the first active pattern ACT1 defined by the device isolation pattern 103. The first active pattern ACT1 may have an 'L'-shaped planar shape. Each of the unit pixel regions PX may include the second active pattern ACT2 or the third active pattern ACT3. The second active pattern ACT2 and the third active pattern ACT3 may be defined by the device isolation pattern 103. When viewed in a plan view, each of the second and third active patterns ACT2 and ACT3 may be disposed in or near an edge region of each of the unit pixel regions PX. In an embodiment, each of the second and third active patterns ACT2 and ACT3 may be a line-shaped pattern extending in the second direction D2. However, the planar shapes of the first to third active patterns ACT1, ACT2, and ACT3 are not limited to those shown in the exemplary embodiment of FIG. 4 and may be variously changed in other embodiments.

The transfer transistor TX, the source-follower transistor SX, the reset transistor RX, and the selection transistor AX previously described with reference to the embodiment of FIG. 1 may be disposed on the first surface 100a of the first substrate 100. The transfer transistor TX may be disposed on the first active pattern ACT1 of each of the unit pixel regions PX. The transfer transistor TX may be electrically connected to the photoelectric conversion region 110. The transfer transistor TX may include the transfer gate TG on the first active pattern ACT1 and the floating diffusion region FD. As shown in the embodiment of FIG. 5, the transfer gate TG may include a lower portion, which is inserted in the first substrate 100 and extends below the first surface 100a, and an upper portion, which is connected to the lower portion and protrudes above the first surface 100a of the first substrate 100. A gate dielectric layer GI may be interposed between the transfer gate TG and the first substrate 100. The floating diffusion region FD may be formed in a region of the first active pattern ACT1 that is located at a side of the transfer gate TG. In an embodiment, the floating diffusion region FD may have the second conductivity type (e.g., n-type), which is different from the first substrate 100.

The gate electrodes may include the transfer gate TG, the selection gate AG, the source-follower gate SG, and the reset gate RG. The transfer gate TG, selection gate AG, source-follower gate SG, and reset gate RG may be disposed on the first surface 100a of the first substrate 100. The source-follower transistor SX and the selection transistor AX may be disposed on the second active patterns ACT2 of the unit pixel regions PX. The source-follower transistor SX may include the source-follower gate SG on the second active pattern ACT2, and the selection transistor AX may include the selection gate AG. The reset transistor RX may be disposed on the third active patterns ACT3 of the unit pixel regions PX. The reset transistor RX may include the reset gate RG on the third active pattern ACT3. In an embodiment, a dual conversion transistor may be further disposed on the third active patterns ACT3. The dual conversion transistor may include a dual conversion gate. The gate dielectric layer GI may be interposed between the first substrate 100 and each of the transfer gate TG, the selection gate AG, the source-follower gate SG, and the reset gate RG.

The first interconnection layer 20 may include first and second interconnection insulating layers 221 and 222, first and second interconnection lines 212 and 213, and vias 215. The first interconnection insulating layer 221 may cover the first surface 100a of the first substrate 100. The first interconnection insulating layer 221 may be disposed between the first and second interconnection lines 212 and 213 and the first surface 100a of the first substrate 100 to cover the transfer gate TG, the selection gate AG, the source-follower gate SG, and the reset gate RG. The second interconnection insulating layers 222 may be stacked on the first interconnection insulating layer 221. The first and second interconnection insulating layers 221 and 222 may be formed of or include at least one non-conductive material. For example, in an embodiment, the first and second interconnection insulating layers 221 and 222 may be formed of or include at least one of silicon-based insulating materials such as silicon oxide, silicon nitride, and/or silicon oxynitride.

The first and second interconnection lines 212 and 213 may be disposed on the first interconnection insulating layer 221. For example, the first and second interconnection lines 212 and 213 may be disposed in the second interconnection insulating layers 222, which are stacked on the first surface 100a of the first substrate 100. As shown in the embodiment of FIG. 5, the image sensor may include two second interconnection insulating layers 222 consecutively stacked on each other (e.g., in the third direction D3). However, in other embodiments the number of the second interconnection insulating layers 222 may be three or more. The first and second interconnection lines 212 and 213 may be vertically connected to the transfer transistor TX, the source-follower transistor SX, the reset transistor RX, and the selection transistor AX through the vias 215. Electrical signals converted by the photoelectric conversion regions 110 may be processed by the first interconnection layer 20. In an embodiment, the first and second interconnection lines 212 and 213 may be arranged independent of the arrangement of the photoelectric conversion regions 110. For example, the first and second interconnection lines 212 and 213 may be disposed to cross over the photoelectric conversion regions 110. In an embodiment, the first and second interconnection lines 212 and 213 and the vias 215 may be formed of or include at least one of metallic materials (e.g., copper (Cu) or tungsten (W)).

The optically-transparent layer 30 may include color filters 303 and micro lenses 307. The optically-transparent layer 30 may be configured to collect and filter an external light and to provide the light to the photoelectric conversion layer 10.

In an embodiment, the color filters 303 and the micro lenses 307 may be disposed on the second surface 100b of the first substrate 100. The color filters 303 may be disposed on the unit pixel regions PX, respectively. For example, each color filter 303 may be arranged to correspond to one unit pixel region PX. However, embodiments of the present inventive concepts are not limited thereto. The micro lenses 307 may be disposed on the color filters 303, respectively. For example, each micro lens 307 may be arranged to correspond to one color filter 303. However, embodiments of the present inventive concepts are not limited thereto. A back-side insulating layer 132 and first auxiliary insulating layers 134 and 136 may be disposed between the second surface 100b of the first substrate 100 and the color filters 303 (e.g., in the third direction D3). The back-side insulating layer 132 may cover the second surface 100b of the first substrate 100. The back-side insulating layer 132 may be in contact with the second surface 100b of the first substrate 100. In an embodiment, the back-side insulating layer 132 may include at least one of a bottom antireflective coating (BARC) layer, a fixed charge layer, an adhesive layer, or a protection layer. In an embodiment in which the back-side insulating layer 132 includes the BARC layer, it may be possible to prevent light, which is incident into the second surface 100b of the first substrate 100, from being reflected, and thus, the incident light may effectively enter the photoelectric conversion regions 110. The back-side insulating layer 132 and the first auxiliary insulating layers 134 and 136 may be formed of or include at least one metal oxide, such as aluminum oxide and/or hafnium oxide, or at least one silicon-based insulating material, such as at least one of silicon oxide or silicon nitride. A second auxiliary insulating layer 305 may be disposed between the color filters 303 and the micro lenses 307 (e.g., in the third direction D3).

The color filters 303 may include primary color filters. The color filters 303 may include first to third color filters having different colors from each other. For example, in an embodiment, the first to third color filters may be or include green, red and blue filters, respectively. The first to third color filters may be arranged in the form of a Bayer pattern. In another embodiment, the first to third color filters may be or include a color filter of other colors, such as cyan, magenta, yellow, etc. A grid pattern GRa may be interposed between the color filters 303.

The micro lenses 307 may be disposed on bottom surfaces of the color filters 303, respectively. The micro lenses 307 may be respectively overlapped with the photoelectric conversion regions 110, when viewed in a plan view. While the embodiment of FIG. 5 shows adjacent micro lenses 307 spaced apart from each other (e.g., in the second direction D2), in other embodiments, the micro lenses 307 may be connected to each other. The micro lenses 307 may be transparent to a visible light. The micro lenses 307 may have a convex shape, and thus, this may make it possible to condense light, which is incident into the unit pixel regions PX. In an embodiment, the micro lenses 307 may be formed of or include at least one of organic materials. For example, the micro lenses 307 may be formed of or include at least one of photoresist materials or thermosetting resins.

The image sensor may further include a protection layer 137. The protection layer 137 may be interposed between the first auxiliary insulating layer 136 and the color filters 303 and between the grid pattern GRa and the color filters 303. In an embodiment, the protection layer 137 may be formed of or include at least one of insulating material, such as high-k dielectric materials, etc. For example, the protection layer 137 may be formed of or include aluminum oxide or hafnium oxide.

Hereinafter, the pixel isolation pattern 150 will be described in more detail with reference to the embodiments of FIGS. 5 and 6.

Referring to the embodiments of FIGS. 5 and 6, the first substrate 100 may have the first trench TR1 defining the unit pixel regions PX. When viewed in a plan view, the first trench TR1 may have a lattice or grid structure. The pixel isolation pattern 150 may be disposed in the first trench TR1 to fill the first trench TR1. The pixel isolation pattern 150 may penetrate the device isolation pattern 103.

The pixel isolation pattern 150 may include a first insulating layer 151, a semiconductor pattern CP, and a capping pattern 157. The semiconductor pattern CP may include a first semiconductor pattern 153 and a second semiconductor pattern 155 which define the unit pixel regions PX of the first substrate 100. The first insulating layer 151 may cover an inner side surface of the first trench TR1. The semiconductor pattern CP and the capping pattern 157 may fill the first trench TR1 which includes the first insulating layer 151. For example, the capping pattern 157 may fill an upper region of the first trench TR1. The semiconductor pattern CP may fill the remaining region of the first trench TR1, other than the upper region.

The first insulating layer 151 may be disposed on an inner surface of the first trench TR1. The first insulating layer 151 may conformally cover the inner surface of the first trench TR1. As shown in the embodiments of FIGS. 5-6, the first insulating layer 151 may have a substantially uniform thickness in the second direction D2. In an embodiment, the thickness of the first insulating layer 151 may be in a range from about 30 Å to about 350 Å. The first insulating layer 151 may have inner side surfaces, which are opposite to each other, when viewed in a cross-sectional view. The inner side surfaces may be parallel to the inner side surfaces of the first trench TR1. The first insulating layer 151 may extend longitudinally from the first surface 100a of the first substrate 100 to the second surface 100b. The first insulating layer 151 may enclose each of the photoelectric conversion regions 110, when viewed in a plan view. The first insulating layer 151 may be interposed between the semiconductor pattern CP and the first substrate 100 and between the capping pattern 157 and the first substrate 100. In an embodiment, a plurality of oxide layers may be further disposed on the first insulating layer 151. The semiconductor pattern CP may be spaced apart from the first substrate 100 by the first insulating layer 151. The semiconductor pattern CP may be electrically isolated from the first substrate 100 by the first insulating layer 151. In an embodiment, the first insulating layer 151 may be formed of or include at least one non-conductive material. As an example, the first insulating layer 151 may include a silicon oxide layer, a silicon oxynitride layer, or a silicon nitride layer.

The semiconductor pattern CP may include the first and second semiconductor patterns 153 and 155. The first semiconductor pattern 153 may be disposed on the first insulating layer 151. The first semiconductor pattern 153 may conformally cover a partial portion of the first insulating layer 151. As shown in the embodiment of FIG. 5, the first semiconductor pattern 153 may not cover an upper portion of the first insulating layer 151. Thus, the upper portion of the first insulating layer 151 may be in contact with the second semiconductor pattern 155 and the capping pattern 157. In an embodiment, the first and second semiconductor patterns 153 and 155 may be formed of or include poly silicon. As an example, the first and second semiconductor patterns 153 and 155 may be formed of or include doped poly silicon. In an embodiment, the first semiconductor pattern 153 may include poly silicon doped with n- or p-type impurities. In another embodiment, the first and second semiconductor patterns 153 and 155 may be formed of or include undoped poly silicon. In certain embodiments, the first semiconductor pattern 153 may be formed of or include doped poly silicon, and the second semiconductor pattern 155 may be formed of or include undoped poly silicon.

As shown in the embodiment of FIG. 6, the first semiconductor pattern 153 may be disposed on the first insulating layer 151 in the first trench TR1. The first semiconductor pattern 153 may be interposed between the second semiconductor pattern 155 and the first insulating layer 151. The first semiconductor pattern 153 may be spaced apart from the first substrate 100 by the first insulating layer 151. Thus, during an operation of the image sensor, the first semiconductor pattern 153 may be electrically separated from the first substrate 100. In an embodiment, the first semiconductor pattern 153 may be formed of or include a crystalline semiconductor material, such as doped poly silicon, etc. The first semiconductor pattern 153 may be doped with n- or p-type impurities, such as boron (B). Alternatively, the first semiconductor pattern 153 may be formed of or include undoped poly silicon. The term "undoped" may mean that an intended doping process is not performed. The first semiconductor pattern 153 may include first and second side portions 153L and 153R and a bottom portion 153U. The first and second side portions 153L and 153R may be disposed on and connected to the bottom portion 153U. The upper portions of the first and second side portions 153L, and 153R may be positioned adjacent to the first surface 100a of the first substrate 100 in contrast with the bottom portion 153U. When viewed in a cross-sectional view, the first and second side portions 153L and 153R are opposite to each other. For example, in an embodiment, the first side portion 153L may be a left side portion and the second side portion 153R may be a right side portion. The first and second side portions 153L and 153R may be disposed in a mirror-symmetric manner. A thickness W3 in the second direction D2, of each of the first and second side portion 153L and 153R may decrease with decreasing distance to the first surface 100a. For example, the thickness W3 of the first side portion 153L adjacent to the first surface 100a of the first substrate 100 may be smaller than the thickness W3 of the first side portion 153L adjacent to the second surface 100b of the first substrate 100. In an embodiment, the thickness W3 may be in a range from about 10 Å to about 500 Å. A first inner side surface 153a of the first side portion 153L and a second inner side surface 153c of the second side portion 153R may be in direct contact with the second semiconductor pattern 155. As shown in the embodiment of FIG. 6, the first and second inner side surfaces 153a and 153c may not be parallel to the inner side surfaces of the first insulating layer 151. A distance W2 in the second direction D2 between the first and second inner side surfaces 153a and 153c may decrease with decreasing distance to the second surface 100b of the first substrate 100. For example, a distance between the first and second side portions 153L and 153R in the second direction D2 may decrease with decreasing distance to the second surface 100b of the first substrate 100.

The bottom portion 153U of the first semiconductor pattern 153 may be disposed on the back-side insulating layer 132 and the first insulating layer 151. For example, a lower surface of the bottom portion 153U of the first semiconductor pattern 153 may directly contact an upper surface of the back-side insulating layer 132 and an outer lateral side surface of the bottom portion 153U of the first semiconductor pattern 153 may directly contact an inner side surface of the first insulating layer 151. The upper surface of the bottom portion 153U of the first semiconductor pattern 153 may be connected to the first side portions 153L and 153R, without any observable interface therebetween. The bottom portion 153U may be closer to the second surface 100b than the first and second side portions 153L and 153R. The bottom portion 153U may fill a portion of the first trench TR1, which is adjacent to the second surface 100b. A bottom surface 153b of the bottom portion 153U may be the bottom surface 153b of the first semiconductor pattern 153. As shown in the embodiment of FIG. 6, the bottom surface 153b of the bottom portion 153U may be positioned at the same level as the second surface 100b of the first substrate 100.

In an embodiment, a level of the topmost portion of the first semiconductor pattern 153 may be a third level lv3. A height H1 of the first semiconductor pattern 153 may be a distance (e.g., length in the third direction D3) from the second surface 100b of the first substrate 100 to the third level lv3. The third level lv3 may be positioned at a level lower than a top surface of the second semiconductor pattern 155. A height H2 (e.g., length in the third direction D3) of the bottom portion 153U of the first semiconductor pattern 153 measured from the second surface 100b of the first substrate 100 may be substantially equal to a distance (e.g., in the third direction D3) between the lowest point of the second semiconductor pattern 155 and the second surface 100b of the first substrate 100. In an embodiment, the height H2 of the bottom portion 153U may range from about 0.1 µm to about 2.5 µm. A ratio of the height H2 to the height H1 may range from about 0.1 to about 0.5.

The second semiconductor pattern 155 may be disposed in the first trench TR1 and on the first semiconductor pattern 153 and the first insulating layer 151. The second semiconductor pattern 155 may be spaced apart from the first substrate 100 with the first insulating layer 151 interposed therebetween. The second semiconductor pattern 155 may be vertically spaced apart from the back-side insulating layer 132 (e.g., in the third direction D3) with the bottom portion 153U of the first semiconductor pattern 153 interposed therebetween. Thus, the second semiconductor pattern 155 may not be in direct contact with the back-side insulating layer 132. The second semiconductor pattern 155 may cover the first and second inner side surfaces 153a and 153c of the first semiconductor pattern 153 and side surfaces of the upper portion of the first insulating layer 151, which is exposed by the first semiconductor pattern 153. In an embodiment, the second semiconductor pattern 155 may include one of doped poly silicon containing n- or p-type impurities and undoped poly silicon. The second semiconductor pattern 155 may include a first portion 155T and a second portion 155U. The first portion 155T may be an upper portion of the second semiconductor pattern 155 that extends above the third level lv3, and the second portion 155U may be a lower portion of the second semiconductor pattern 155 that extends below the third level lv3. The first portion 155T may be closer to the first surface 100a of the first substrate 100 than the second portion 155U. The first portion 155T may be disposed at a level higher than the first and second side portions 153L and 153R of the first semiconductor pattern 153. As shown in the embodiment of FIG. 6, a top surface of the first portion 155T may directly contact a lower surface of the capping pattern 157. A level of a top surface of the first portion 155T may be a second level lv2. A width W1 of the first portion 155T (e.g., length in the second direction D2) may be larger than a width (e.g., length in the second direction D2) of the second portion 155U.

The second portion 155U may be interposed between the first and second inner side surfaces 153a and 153c of the first semiconductor pattern 153 and may extend vertically (e.g., in the third direction D3) from a lower portion first portion 155T towards the second surface 100b of the first substrate 100. The second portion 155U may be connected to (e.g., integral with) the first portion 155T, without any observable interface therebetween. The second portion 155U may be spaced apart from the first insulating layer 151 with the first and second side portions 153L and 153R of the first semiconductor pattern 153 interposed therebetween. The second portion 155U may be enclosed by the side portion of the first semiconductor pattern 153. The second portion 155U may directly contact the first and second inner side surfaces 153a and 153c of the first semiconductor pattern 153. The second portion 155U may fill a region between the first and second inner side surfaces 153a and 153c. A width W2 of the second portion 155U (e.g., length in the second direction D2) may decrease with decreasing distance to the second surface 100b of the first substrate 100. A width W2 of the second portion 155U (e.g., length in the second direction D2) at a specific level may be equal to a distance (e.g., length in the second direction D2) between the opposing first and second inner side surfaces 153a and 153c of the first semiconductor pattern 153 at that level. The lowermost point of the second portion 155U may be the lowermost point of the second semiconductor pattern 155. The lowermost point of the second portion 155U may be positioned at a level that is higher than the second surface 100b of the first substrate 100. A level of the lowermost point of the second portion 155U may be a fourth level lv4.

The capping pattern 157 may be disposed on the first and second semiconductor patterns 153 and 155. The capping pattern 157 may be in direct contact with the second semiconductor pattern 155, but may not be in direct contact with the first semiconductor pattern 153. The capping pattern 157 may be disposed adjacent to the first surface 100a of the first substrate 100. As shown in the embodiment of FIG. 6, a top surface of the capping pattern 157 may be coplanar with the first surface 100a of the first substrate 100. A bottom surface of the capping pattern 157 may be in direct contact with the top surface of the second semiconductor pattern 155. In an embodiment, the capping pattern 157 may be formed of or include at least one non-conductive material. For example, the capping pattern 157 may be formed of or include at least one of silicon-based insulating materials, such as silicon nitride, silicon oxide, and/or silicon oxynitride and/or high-k dielectric materials, such as hafnium oxide and/or aluminum oxide. Thus, the pixel isolation pattern 150 may prevent photocharges, which are produced in the unit pixel regions PX by an incident light, from being diffused into neighboring ones of the unit pixel regions PX through a random drift process. For example, the pixel isolation pattern 150 may prevent a cross-talk issue from occurring between the unit pixel regions PX.

Figure 7:
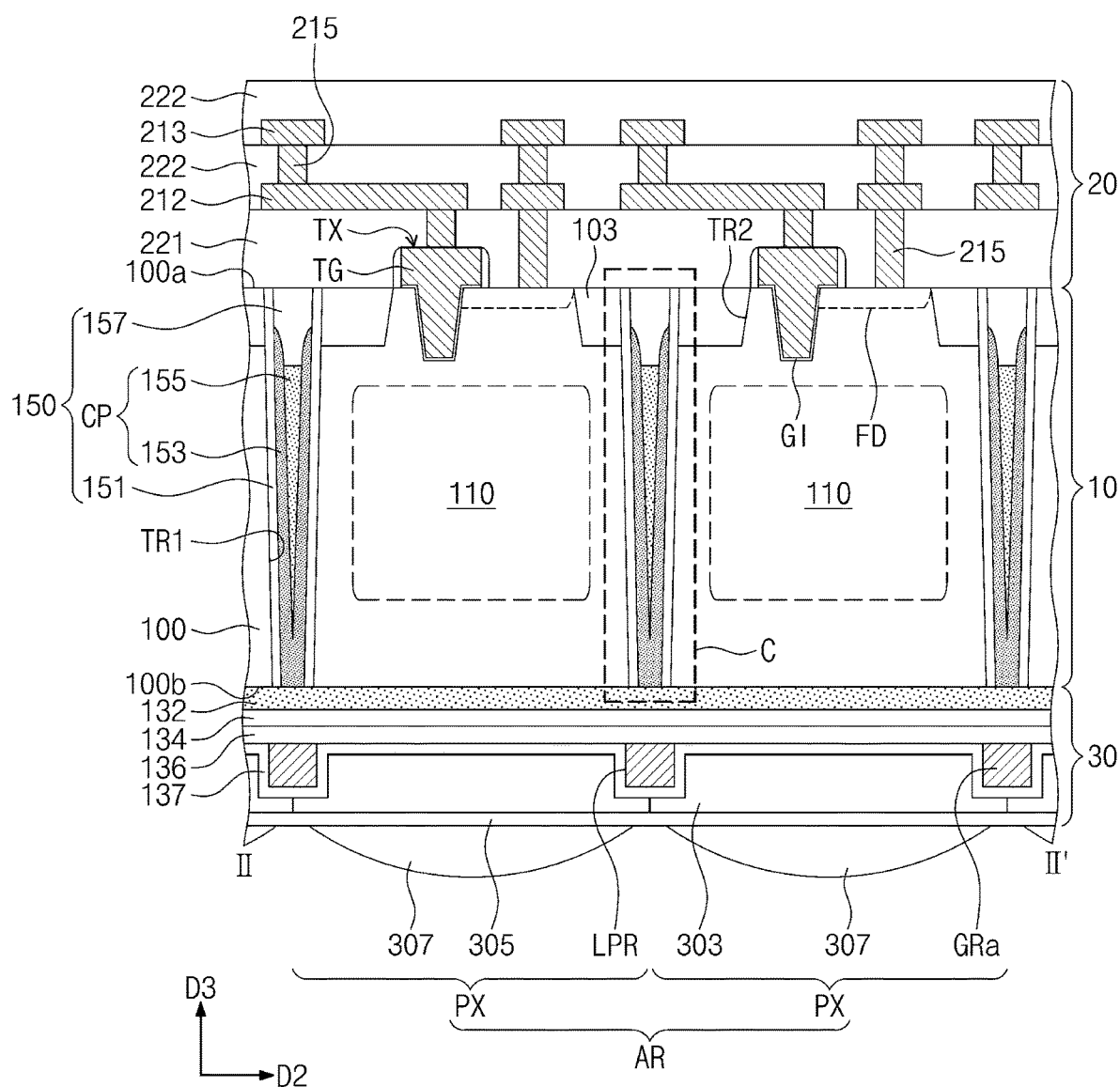
FIG. 7 is a cross-sectional view taken along the line II-II' of FIG. 4 illustrating a pixel array region of an image sensor according to an embodiment of the present inventive concepts.
Figure 8:
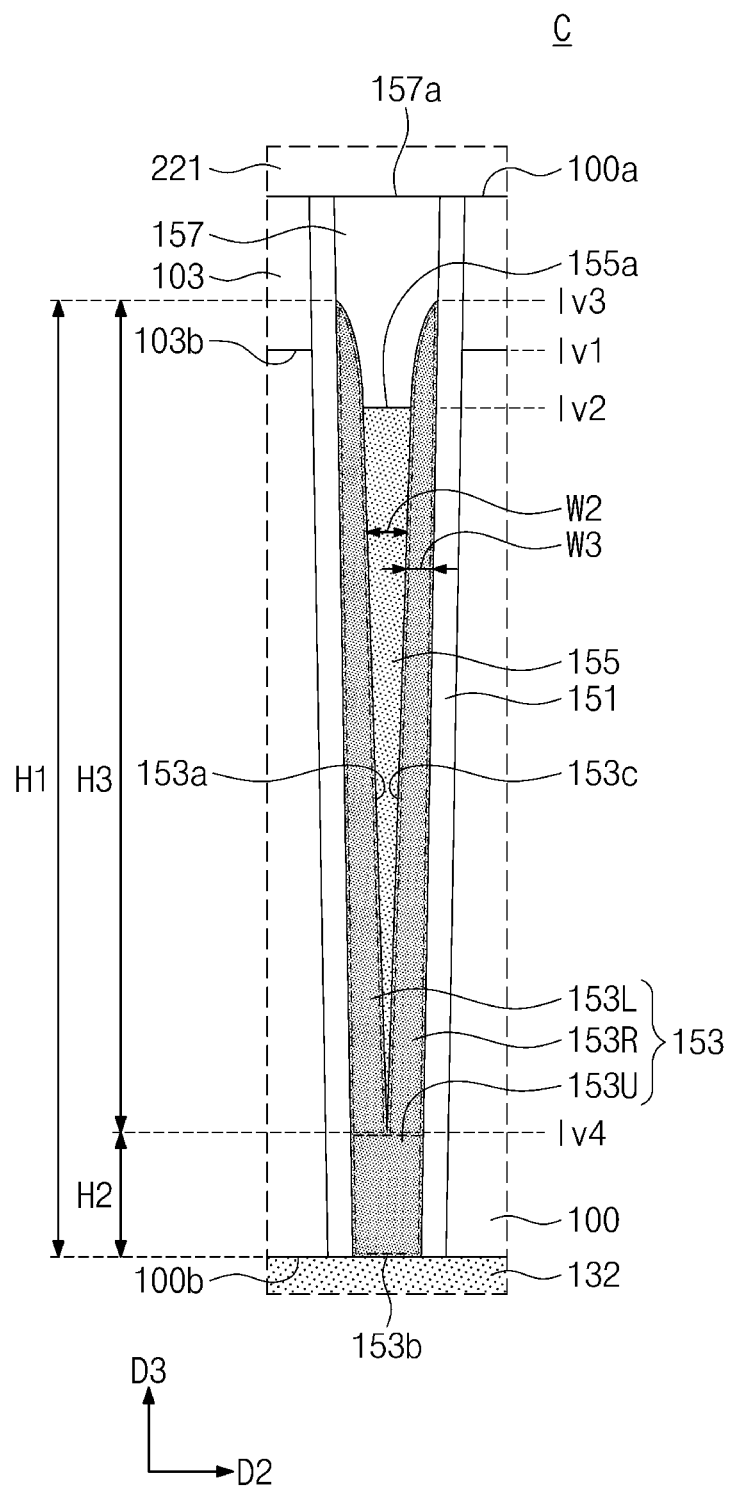
FIG. 8 is a cross-sectional view of a pixel array region of an image sensor illustrating an enlarged shape of region C of FIG. 7 according to an embodiment of the present inventive concepts.

FIG. 7 is a cross-sectional view taken along line II-II' of FIG. 4 to illustrate a pixel array region of an image sensor according to an embodiment of the present inventive concepts. FIG. 8 is a cross-sectional view illustrating an enlarged shape of a region C of FIG. 7. For concise description, a previously described element may be identified by the same reference number without repeating an overlapping description thereof.

Referring to the embodiments of FIGS. 7 and 8, an image sensor may include the photoelectric conversion layer 10, the transfer gate TG, the source-follower gate SG, the reset gate RG, and the selection gate AG, the first interconnection layer 20, and the optically-transparent layer 30. The photoelectric conversion layer 10 may include the first substrate 100, the pixel isolation pattern 150, and the device isolation pattern 103. The first substrate 100, the device isolation pattern 103, the transfer gate TG, the source-follower gate SG, the reset gate RG, and the selection gate AG, the first interconnection layer 20, and the optically-transparent layer 30 may be configured to have substantially the same features as those of the embodiments of FIGS. 2 to 6.

The pixel isolation pattern 150 may be disposed in the first trench TR1. The pixel isolation pattern 150 may include the first insulating layer 151, the semiconductor pattern CP, and the capping pattern 157. The semiconductor pattern CP may include the first and second semiconductor patterns 153 and 155. The first insulating layer 151 may be configured to have substantially the same features as those of the embodiments of FIGS. 5 and 6.

The first semiconductor pattern 153 may be disposed on the first insulating layer 151 in the first trench TR1. The first semiconductor pattern 153 may include the first and second side portions 153L and 153R and the bottom portion 153U. The first and second side portions 153L and 153R may be disposed on and connected to the bottom portion 153U. The first and second side portions 153L and 153R may be positioned closer to the first surface 100a of the first substrate 100, compared with the bottom portion 153U. When viewed in a cross-sectional view, the side portions may include the first side portion 153L and the second side portion 153R, which are opposite to each other. The first and second side portions 153L and 153R may be disposed in a mirror-symmetric manner. A level of the topmost portion of the first semiconductor pattern 153 may be a third level lv3. A level of the bottom surface of the device isolation pattern 103 may be a first level lv1. A level of a top surface 155a of the second semiconductor pattern 155 may be a second level lv2. The third level lv3 may be positioned higher than the first level lv1. The first level lv1 may be disposed between the second level lv2 and the third level lv3. For example, the first and second side portions 153L and 153R of the first semiconductor pattern 153 may extend toward the first surface 100a of the first substrate 100 so that the topmost portion of the first semiconductor pattern 153 is positioned at a level that is higher than a level of the bottom surface of the device isolation pattern 103. However, embodiments of the present inventive concepts are not limited thereto. For example, in another embodiment, the third level lv3 may be positioned between the first level lv1 and the second level lv2.

The second semiconductor pattern 155 may fill a region between the first and second inner side surfaces 153a and 153c of the first semiconductor pattern 153. The top surface 155a of the second semiconductor pattern 155 may be positioned at a level lower than the third level lv3. A width W2 of the second semiconductor pattern 155 (e.g., length in the second direction D2) may decrease with decreasing distance to the second surface 100b of the first substrate 100. Accordingly, when viewed in a cross-sectional view, the second semiconductor patient 155 may have a downwardly-tapered inverted triangle shape. The level lv4 of the lower-most point of the second semiconductor pattern 155 may be higher than a level of the second surface 100b of the first substrate 100. The second semiconductor pattern 155 may be spaced apart from the back-side insulating layer 132 (e.g., in the third direction D3) with the bottom portion 153U of the first semiconductor pattern 153 interposed therebetween. Thus, the second semiconductor pattern 155 may not be in direct contact with the back-side insulating layer 132.

The capping pattern 157 may be disposed on the first and second semiconductor patterns 153 and 155. The capping pattern 157 may extend into a region between the first and second inner side surfaces 153a and 153c of the first semiconductor pattern 153 and may directly contact the top surface 155a of the second semiconductor pattern 155. The capping pattern 157 may also directly contact upper portions of the first and second inner side surfaces 153a and 153c that extend above the top surface 155a of the second semiconductor pattern 155. As shown in the embodiment of FIG. 8, a top surface 157a of the capping pattern 157 may be coplanar with the first surface 100a of the first substrate 100. In an embodiment, the capping pattern 157 may be formed of or include at least one non-conductive material. For example, the capping pattern 157 may be formed of or include at least one of silicon-based insulating materials, such as silicon nitride, silicon oxide, and/or silicon oxynitride and/or high-k dielectric materials, such as hafnium oxide and/or aluminum oxide.

Figure 9:
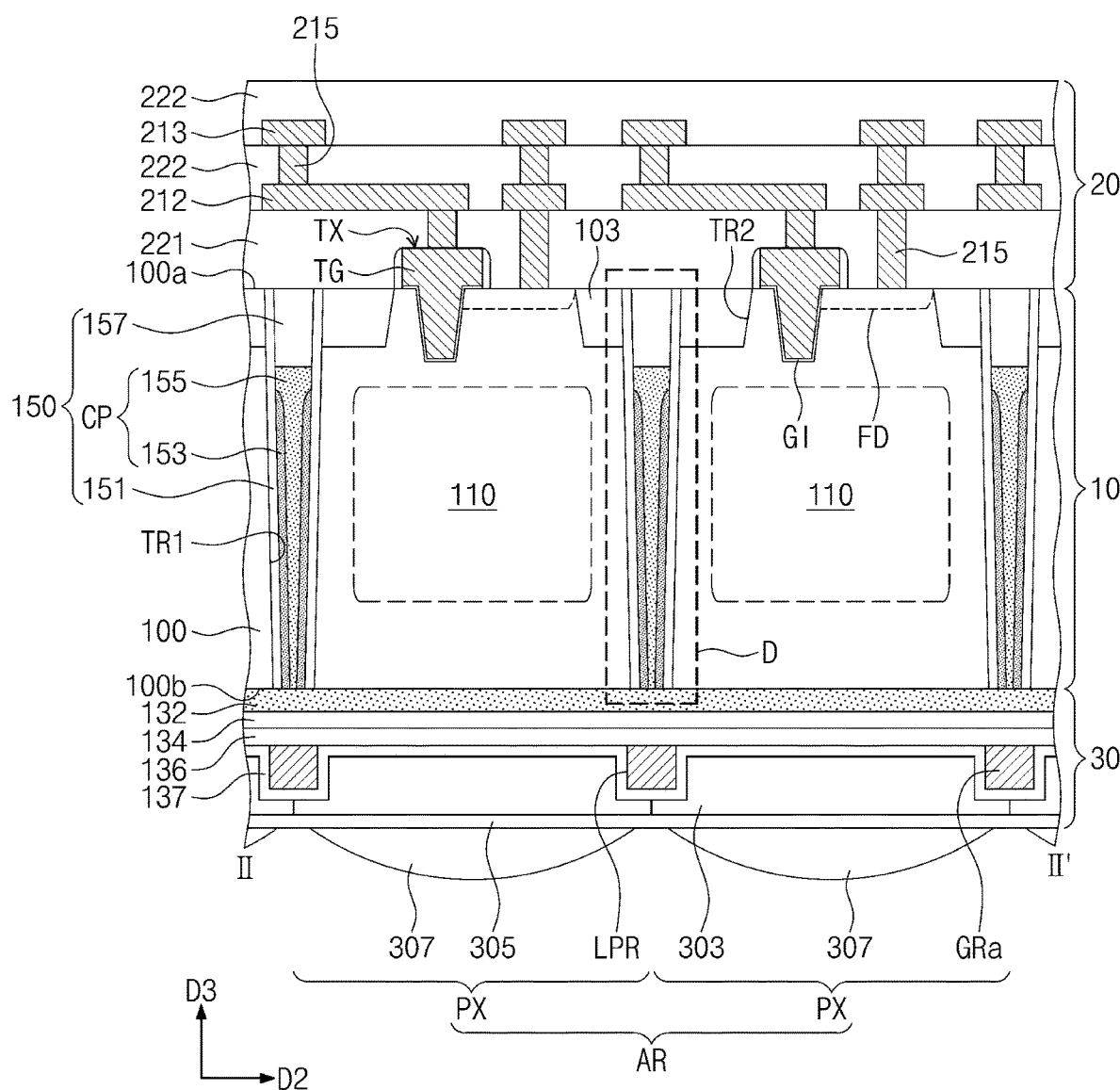
FIG. 9 is a cross-sectional view taken along the line II-II' of FIG. 4 illustrating a pixel array region of an image sensor according to an embodiment of the present inventive concepts.
Figure 10:
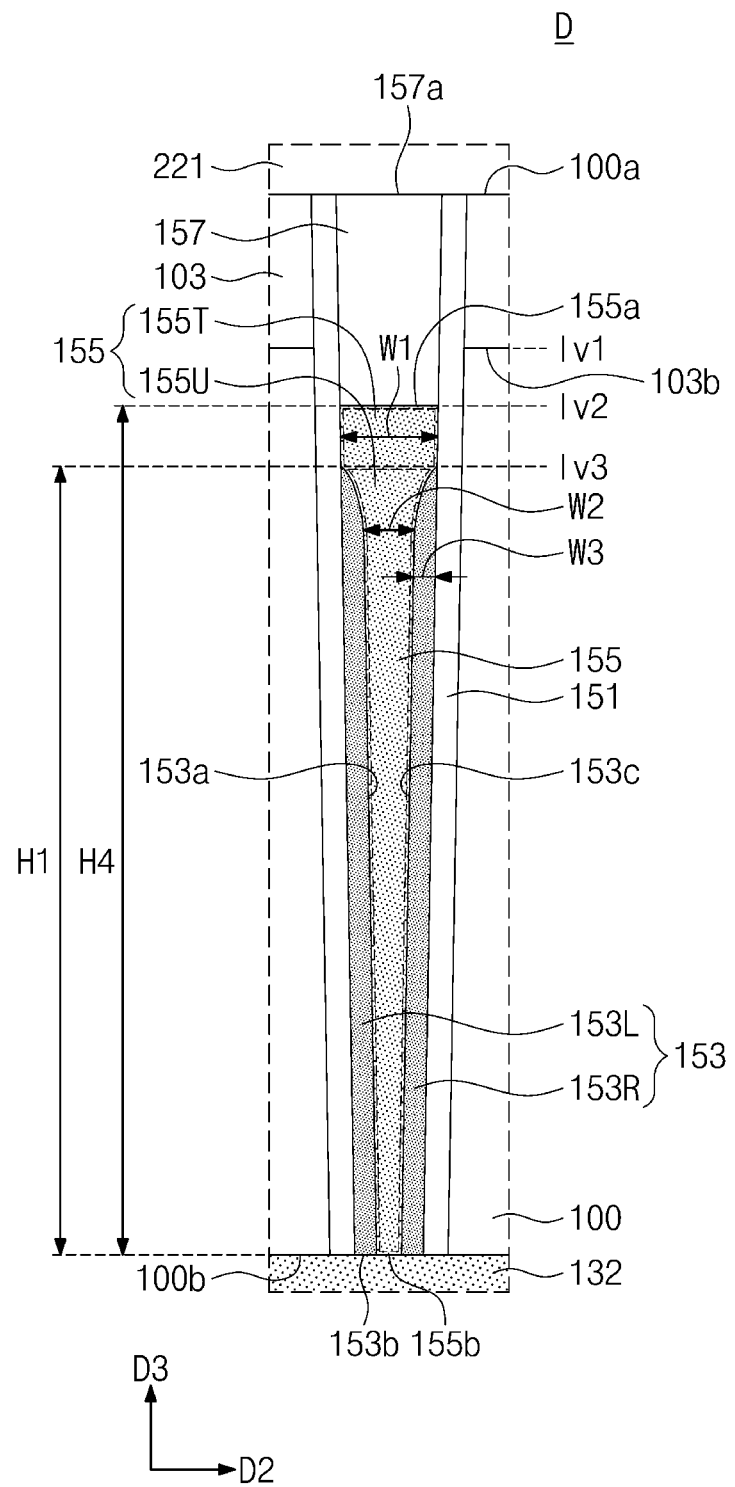
FIG. 10 is a cross-sectional view of a pixel array region of an image sensor illustrating an enlarged shape of region D of FIG. 9 according to an embodiment of the present inventive concepts.

FIG. 9 is a cross-sectional view taken along line II-II' of FIG. 4 to illustrate a pixel array region of an image sensor according to an embodiment of the present inventive concepts. FIG. 10 is a cross-sectional view illustrating an enlarged shape of a region D of FIG. 9. For concise description, a previously described element may be identified by the same reference number without repeating an overlapping description thereof.

Referring to the embodiments of FIGS. 9 and 10, an image sensor may include the photoelectric conversion layer 10, the transfer gate TG, the source-follower gate SG, the reset gate RG, and the selection gate AG, the first interconnection layer 20, and the optically-transparent layer 30. The photoelectric conversion layer 10 may include the first substrate 100, the pixel isolation pattern 150, and the device isolation pattern 103. The first substrate 100, the device isolation pattern 103, the transfer gate TG, the source-follower gate SG, the reset gate RG, and the selection gate AG, the first interconnection layer 20, and the optically-transparent layer 30 may be configured to have substantially the same features as those of the embodiments of FIGS. 2 to 6.

The pixel isolation pattern 150 may be disposed in the first trench TR1. The pixel isolation pattern 150 may include the first insulating layer 151, the semiconductor pattern CP, and the capping pattern 157. The semiconductor pattern CP may include the first and second semiconductor patterns 153 and 155. The first insulating layer 151 may be configured to have substantially the same features as those shown in the embodiments of FIGS. 5 and 6.

The first semiconductor pattern 153 may be disposed on the first insulating layer 151 in the first trench TR1. In an embodiment, the first semiconductor pattern 153 may not include a bottom portion. The first semiconductor pattern 153 may have a shape enclosing the photoelectric conversion region 110, when viewed in a plan view. The first semiconductor patient 153 may include the first side portion 153L and the second side portion 153R, which are spaced apart from each other, when viewed in a cross-sectional view. A distance W2 (e.g., length in the second direction D2) between the first inner side surface 153a of the first side portion 153L and the second inner side surface 153c of the second side portion 153R may decrease with decreasing distance to the second surface 100b of the first substrate 100. The first side portion 153L and the second side portion 153R may be arranged to be symmetric about each other. A thickness W3 of the first side portion 153L (e.g., length in the second direction D2) may decrease with decreasing distance to the second surface 100b of the first substrate 100. For example, the thickness W3 of the first side portion 153L may be smaller proximate to the first surface 100a than portions proximate to the second surface 100b. The thickness of the second side portion 153R at a specific level may be substantially the same as the thickness W3 of the first side portion 153L at such level. In an embodiment, the first semiconductor pattern 153 may be formed of or include doped poly silicon. For example, the first semiconductor pattern 153 may include a poly silicon layer that is doped with n- or p-type impurities, such as boron (B).

The second semiconductor pattern 155 may be disposed in the first trench TR1 and on the first semiconductor pattern 153 and the first insulating layer 151. In an embodiment, the second semiconductor pattern 155 may include one of doped poly silicon containing n- or p-type impurities and undoped poly silicon. The second semiconductor pattern 155 may be spaced apart from the first substrate 100 with the first insulating layer 151 interposed therebetween. The second semiconductor pattern 155 may extend into a region between the first and second inner side surfaces 153a and 153c of the first semiconductor pattern 153 and may directly contact the back-side insulating layer 132. For example, as shown in the embodiment of FIG. 10, a bottom surface 155b of the second semiconductor pattern 155 may directly contact an upper surface of the back-side insulating layer 132. The second semiconductor pattern 155 may include the first portion 155T and the second portion 155U. The width W1 of the first portion 155T (e.g., length in the second direction D2) may be larger than a width of the second portion 155U (e.g., length in the second direction D2). The first portion 155T may be an upper portion of the second semiconductor pattern 155, and the second portion 155U may be a lower portion of the second semiconductor pattern 155. The first portion 155T may be closer to the first surface 100a of the first substrate 100 than the second portion 155U. The first portion 155T may be positioned at a level higher than the first and second side portions 153L and 153R of the first semiconductor pattern 153. A top surface of the first portion 155T may directly contact a lower surface of the capping pattern 157.

In an embodiment, a level of the topmost portion of the first semiconductor pattern 153 may be a third level lv3. A level of the top surface 155a of the second semiconductor pattern 155 may be a second level lv2. The third level lv3 may be lower than the second level lv2. The height H1 (e.g., length in the third direction D3) of the first semiconductor pattern 153 may be smaller than a height H4 (e.g., length in the third direction D3) of the second semiconductor pattern 155. The bottom surface 153b of the first semiconductor pattern 153, a bottom surface 155b of the second semiconductor pattern 155, and the second surface 100b of the first substrate 100 may be coplanar with each other.

The capping pattern 157 may be disposed on the second semiconductor pattern 155. The capping pattern 157 may directly contact the second semiconductor pattern 155 but may not be in direct contact with the first semiconductor pattern 153. The capping pattern 157 may be disposed adjacent to the first surface 100a of the first substrate 100. A top surface of the capping patient 157 may be coplanar with the first surface 100a of the first substrate 100. A bottom surface of the capping pattern 157 may directly contact die top surface of the second semiconductor pattern 155. In an embodiment, the capping pattern 157 may be formed of or include at least one non-conductive material. As an example, the capping pattern 157 may be formed of or include at least one of silicon-based insulating materials, such as silicon nitride, silicon oxide, and/or silicon oxynitride, and/or high-k dielectric materials, such as hafnium oxide and/or aluminum oxide.

Figure 11:
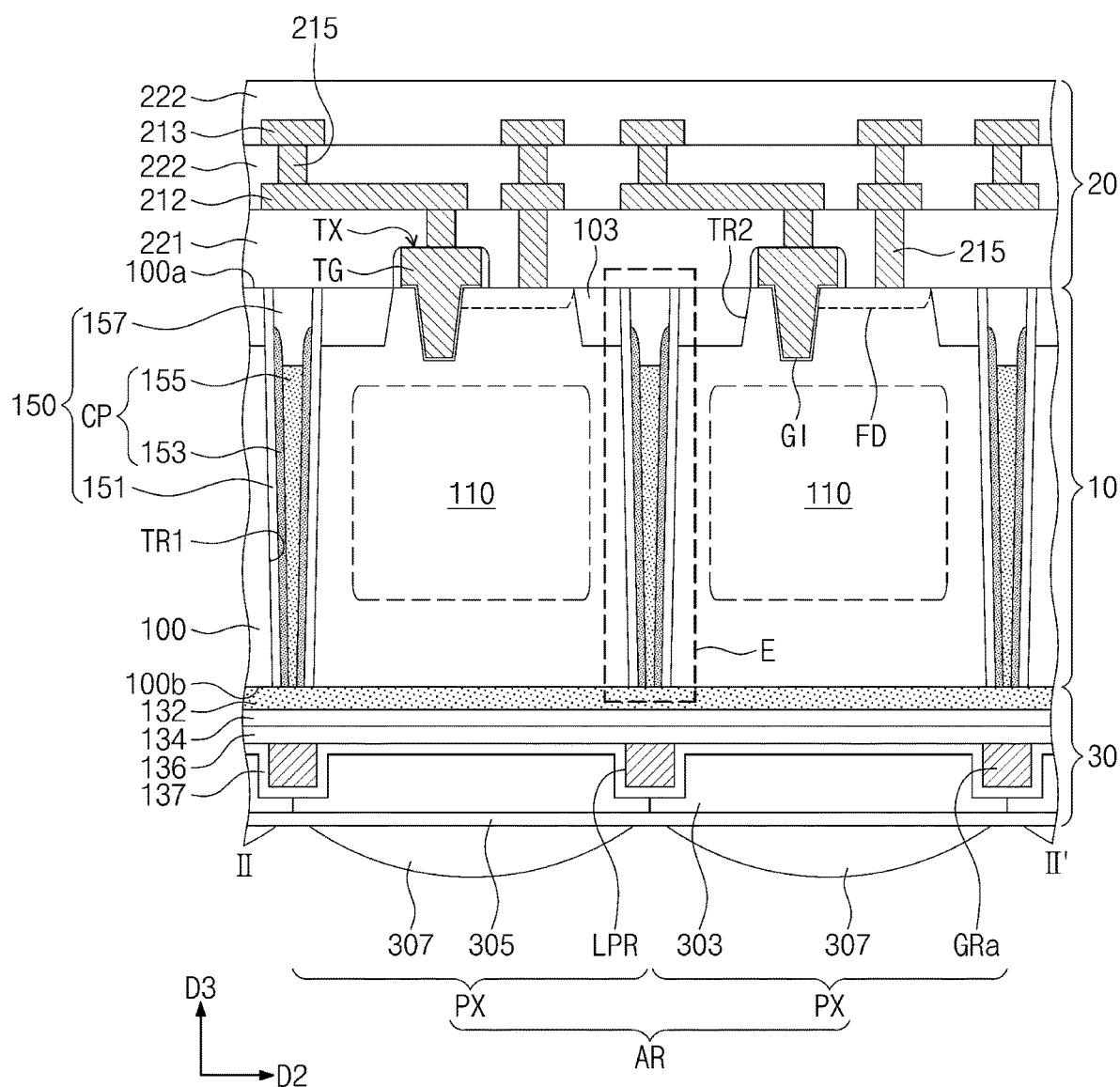
FIG. 11 is a cross-sectional view taken along the line II-II' of FIG. 4 illustrating a pixel array region of an image sensor according to an embodiment of the present inventive concepts.
Figure 12:
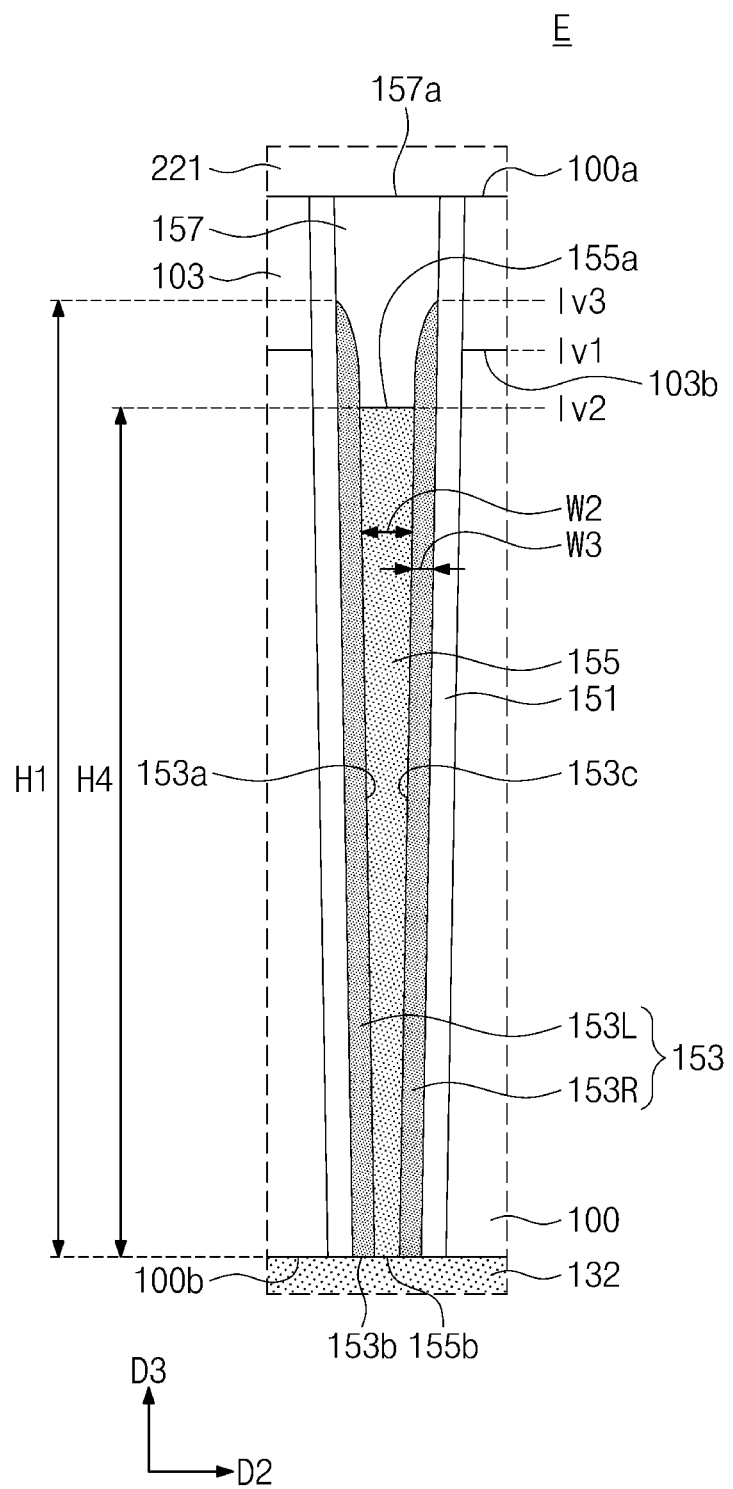
FIG. 12 is a cross-sectional view of a pixel array region of an image sensor illustrating an enlarged shape of region E of FIG. 11 according to an embodiment of the present inventive concepts.

FIG. 11 is a cross-sectional view taken along the line II-II' of FIG. 4 to illustrate a pixel array region of an image sensor according to an embodiment of the present inventive concepts. FIG. 12 is a cross-sectional view illustrating an enlarged shape of a region E of FIG. 11. For concise description, a previously described element may be identified by the same reference number without repeating an overlapping description thereof.

Referring to the embodiments of FIGS. 11 and 12, the photoelectric conversion layer 10 may include the first substrate 100, the pixel isolation pattern 150, and the device isolation pattern 103. The first substrate 100, the device isolation pattern 103, the transfer gate TG, the source-follower gate SG, the reset gate RG, and the selection gate AG, the first interconnection layer 20, and the optically-transparent layer 30 may be configured to have substantially the same features as those of the embodiments of FIGS. 2 to 6.

The pixel isolation pattern 150 may be disposed in the first trench TR1. The pixel isolation pattern 150 may include the first insulating layer 151, the semiconductor pattern CP, and the capping pattern 157. The semiconductor pattern CP may include the first and second semiconductor patterns 153 and 155. The first insulating layer 151 may be configured to have substantially the same features as those of the embodiments of FIGS. 5 and 6.

The first semiconductor pattern 153 may be disposed in the first trench TR1 and on the first insulating layer 151. In an embodiment, the first semiconductor pattern 153 may not include a bottom portion. In an embodiment, the first semiconductor pattern 153 may be arranged to enclose the photoelectric conversion region 110, when viewed in a plan view. The first semiconductor pattern 153 may include a first side portion 153L and a second side portion 153R, which are spaced apart from each other, when viewed in a cross-sectional view. A distance W2 (e.g., length in the second direction D2) between the first inner side surface 153a of the first side portion 153L and the second inner side surface 153c of the second side portion 153R may decrease with decreasing distance to the second surface 100b of the first substrate 100. The first side portion 153L and the second side portion 153R may be arranged to be symmetric about each other. A thickness W3 of the first side portion 153L in the second direction D2 may decrease with decreasing distance to the second surface 100b of the first substrate 100. For example, the thickness W3 of the first side portion 153L may be smaller proximate to the first surface 100a than portions proximate to the second surface 100b. The thickness of the second side portion 153R at a specific level may be substantially the same as the thickness W3 of the first side portion 153L at such level. In an embodiment, the first semiconductor pattern 153 may be formed of or include doped poly silicon. For example, the first semiconductor pattern 153 may include a poly silicon layer that is doped with n- or p-type impurities, such as boron (B).

In an embodiment, a level of the topmost portion of the first semiconductor pattern 153 may be a third level lv3. A level of the bottom surface of the device isolation pattern 103 may be a first level lv1. A level of the top surface 155a of the second semiconductor pattern 155 may be a second level lv2. The third level lv3 may be higher than the first level lv1 and the second level lv2. The third level lv3 may be positioned between the first surface 100a of the first substrate 100 and a bottom surface 103b of the device isolation pattern 103 (e.g., in the third direction D3). The first level lv1 may be positioned between the second level lv2 and the third level lv3. For example, the first and second side portions 153L and 153R of the first semiconductor pattern 153 may extend towards the first surface 100a of the first substrate 100 so that the level lv3 of the topmost portion of the first semiconductor pattern 153 is positioned at a level higher than the level lv1 of the bottom surface 103b of the device isolation pattern 103. In an embodiment, a ratio of a distance (e.g., length in the third direction D3) from the top surface 155a of the second semiconductor pattern 155 to the level lv3 of a topmost surface of the first semiconductor pattern 153 to a height of the capping pattern 157 may range from about 0.1 to about 0.6. However, embodiments of the present inventive concepts are not limited thereto. For example, in another embodiment, the third level lv3 may be positioned between the first level lv1 and the second level lv2. Thus, the height H1 of the first semiconductor pattern 153 may be larger than the height H4 of the second semiconductor pattern 155. The bottom surface 153b of the first semiconductor pattern 153, the bottom surface 155b of the second semiconductor pattern 155, and the second surface 100b of the first substrate 100 may be coplanar with each other.

The capping pattern 157 may be disposed on the first and second semiconductor patterns 153 and 155. The capping pattern 157 may extend into a region between the first and second inner side surfaces 153a and 153c of the first semiconductor pattern 153 and a lower surface of the capping pattern 157 may directly contact the top surface 155a of the second semiconductor pattern 155. The capping pattern 157 may directly contact upper portions of the first and second inner side surfaces 153a and 153c extended above the top surface 155a of the second semiconductor pattern 155. The top surface 157a of the capping pattern 157 may be coplanar with the first surface 100a of the first substrate 100. In an embodiment, the capping pattern 157 may be formed of or include at least one non-conductive material. As an example, the capping pattern 157 may be formed of or include at least one of silicon-based insulating materials, such as silicon nitride, silicon oxide, and/or silicon oxynitride and/or high-k dielectric materials, such as hafnium oxide and/or aluminum oxide.

FIGS. 13 to 21 are cross-sectional views, which are taken along the line II-II' of FIG. 4 illustrating a method of fabricating an image sensor, according to embodiments of the present inventive concepts.

Figure 13:
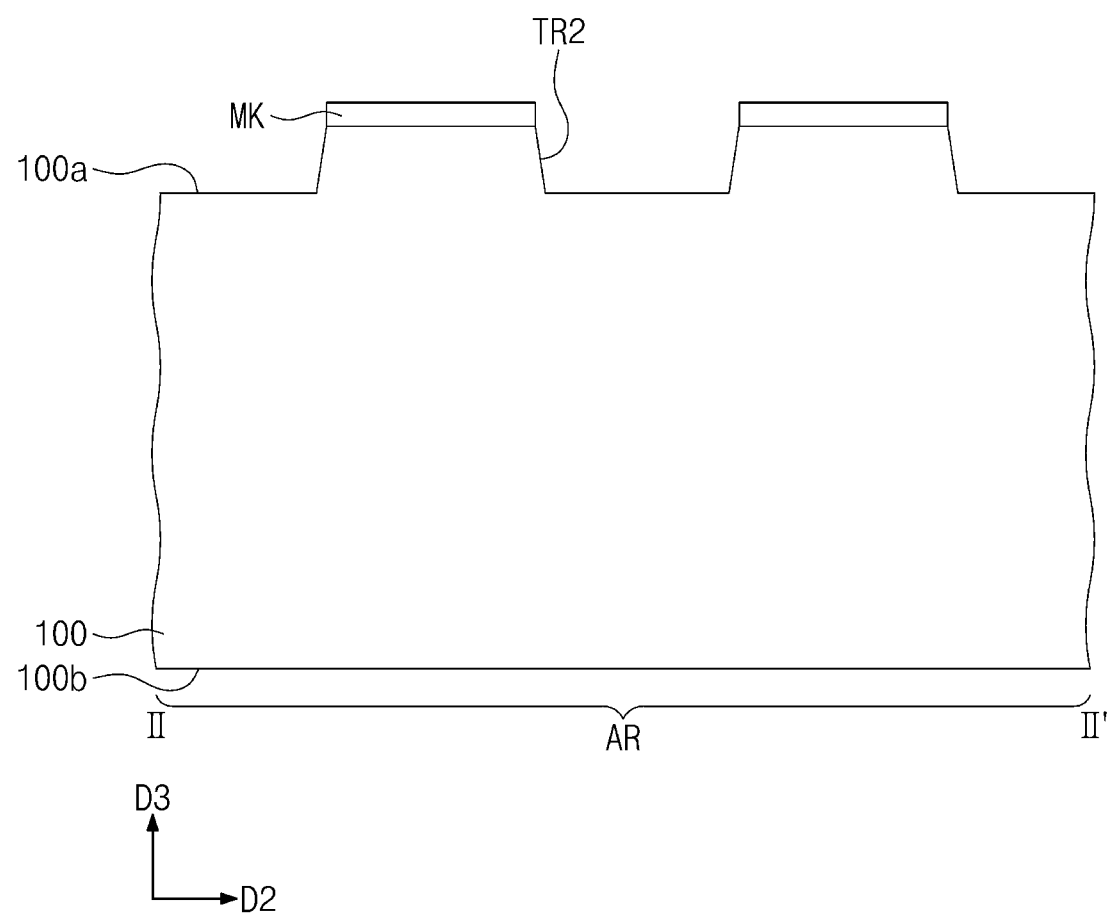
FIGS. 13 to 21 are cross-sectional views, which are taken along the line II-II' of FIG. 4 illustrating a method of fabricating an image sensor, according to embodiments of the present inventive concepts.

Referring to FIG. 13 in conjunction with FIG. 3, a first substrate 100 may be prepared, and the first substrate 100 may have first and second surfaces 100a and 100b, which are opposite to each other. The first substrate 100 may include a pixel array region AR, an optical black region OB, and a pad region PR. In an embodiment, the first substrate 100 may be doped to have a first conductivity type (e.g., p-type). In an embodiment, the first substrate 100 may be a substrate including a bulk silicon substrate having the first conductivity type, and an epitaxial layer, which is provided on the bulk silicon substrate and is of the first conductivity type. Alternatively, the first substrate 100 may be a bulk substrate, in which a well of a first conductivity type is formed.

A second trench TR2 may be formed in the first surface 100a of the first substrate 100. As shown in the embodiment of FIG. 13, the formation of the second trench TR2 may include forming a mask pattern MK on the first surface 100a of the first substrate 100 and etching the first surface 100a using the mask pattern MK.

Figure 14:
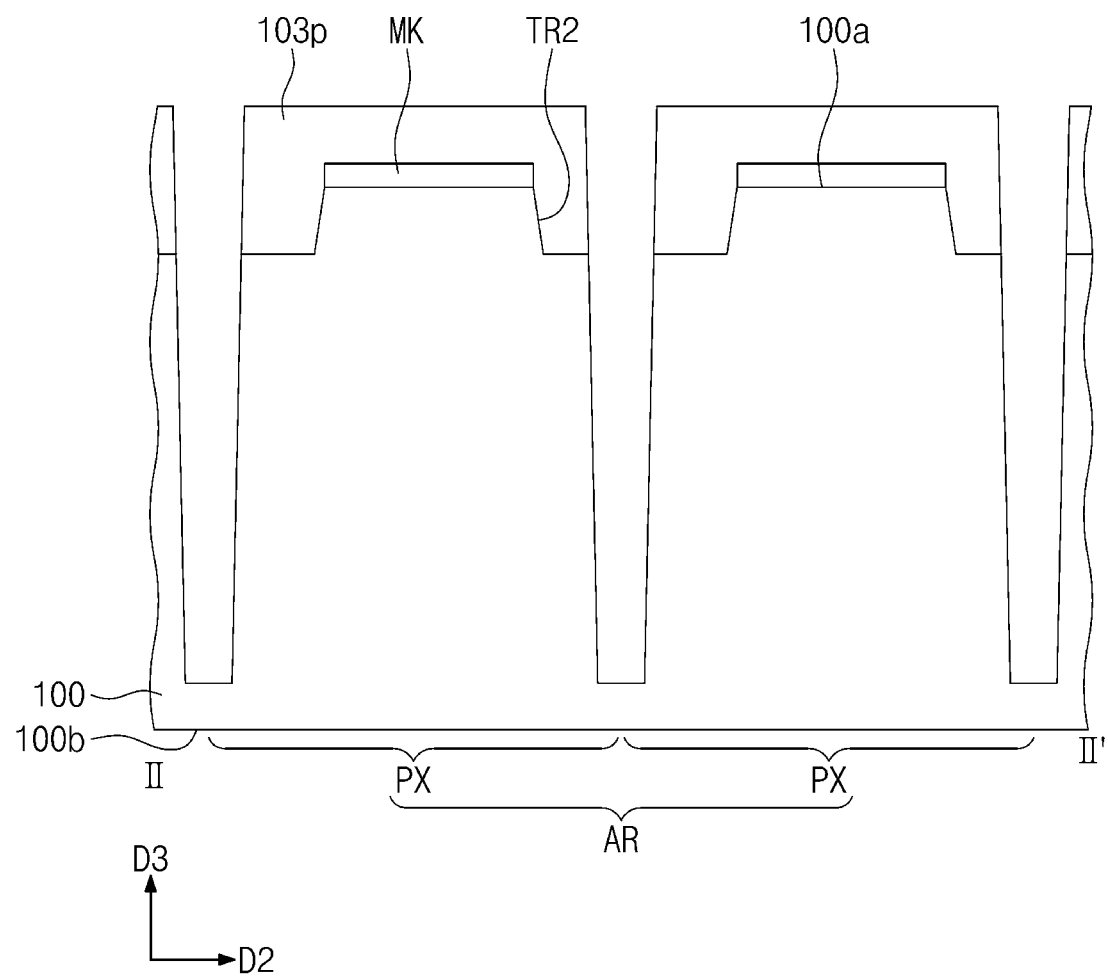
Figure 15:
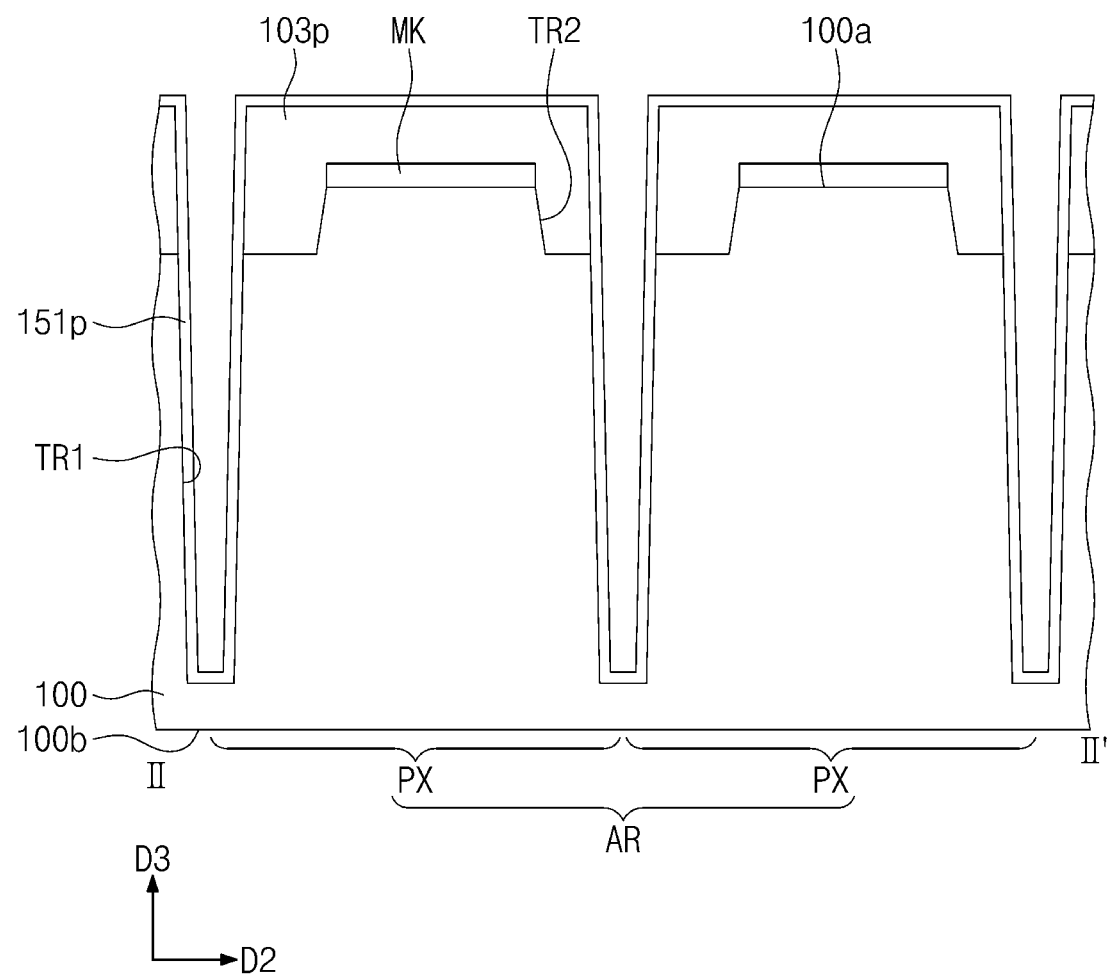

Referring to the embodiments of FIGS. 14-15, a first trench TR1 may be formed in the first surface 100a of the first substrate 100. Prior to the formation of the first trench TR1, a preliminary device isolation layer 103p may be formed on the first surface 100a of the first substrate 100. In an embodiment, the preliminary device isolation layer 103p may be formed by a deposition process. The preliminary device isolation layer 103p may be formed to completely fill the second trench TR2 and to cover the mask pattern MK. A top surface of the preliminary device isolation layer 103p may be formed at a level higher than the first surface 100a of the first substrate 100. In an embodiment, the first trench TR1 may be formed by forming a mask on the preliminary device isolation layer 103p and anisotropically etching the preliminary device isolation layer 103p and the first substrate 100. A bottom surface TR1b of the first trench TR1 may be formed at a level higher than the second surface 100b of the first substrate 100. In an embodiment, the preliminary device isolation layer 103p may be formed of or include at least one compound selected from silicon oxide, silicon nitride, and/or silicon oxynitride. However, embodiments of the present inventive concepts are not limited thereto.

Referring to the embodiment of FIG. 15, after the formation of the first trench TR1, a first preliminary insulating layer 151p may be formed to conformally cover an inner surface of the first trench TR1. The first preliminary insulating layer 151p may also cover a top surface of the preliminary device isolation layer 103p in addition to the inner surface of the first trench TR1. In an embodiment, the first preliminary insulating layer 151p may be formed by depositing an insulating material on the first substrate 100 in which the first trench TR1 is formed. In an embodiment, the first preliminary insulating layer 151p may be formed of or include at least one compound selected from silicon oxide, silicon nitride, and/or silicon oxynitride. However, embodiments of the present inventive concepts are not limited thereto.

Figure 16:
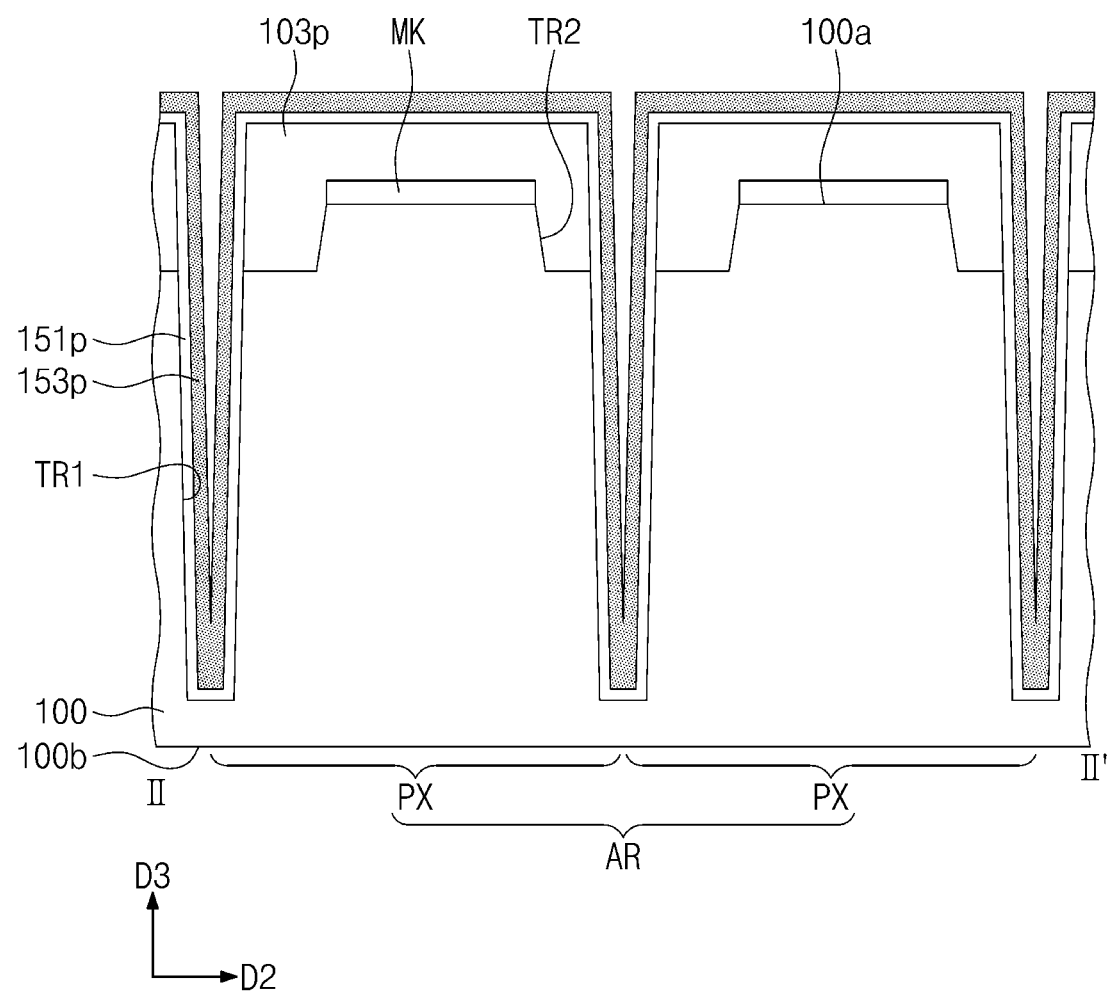
Figure 17:
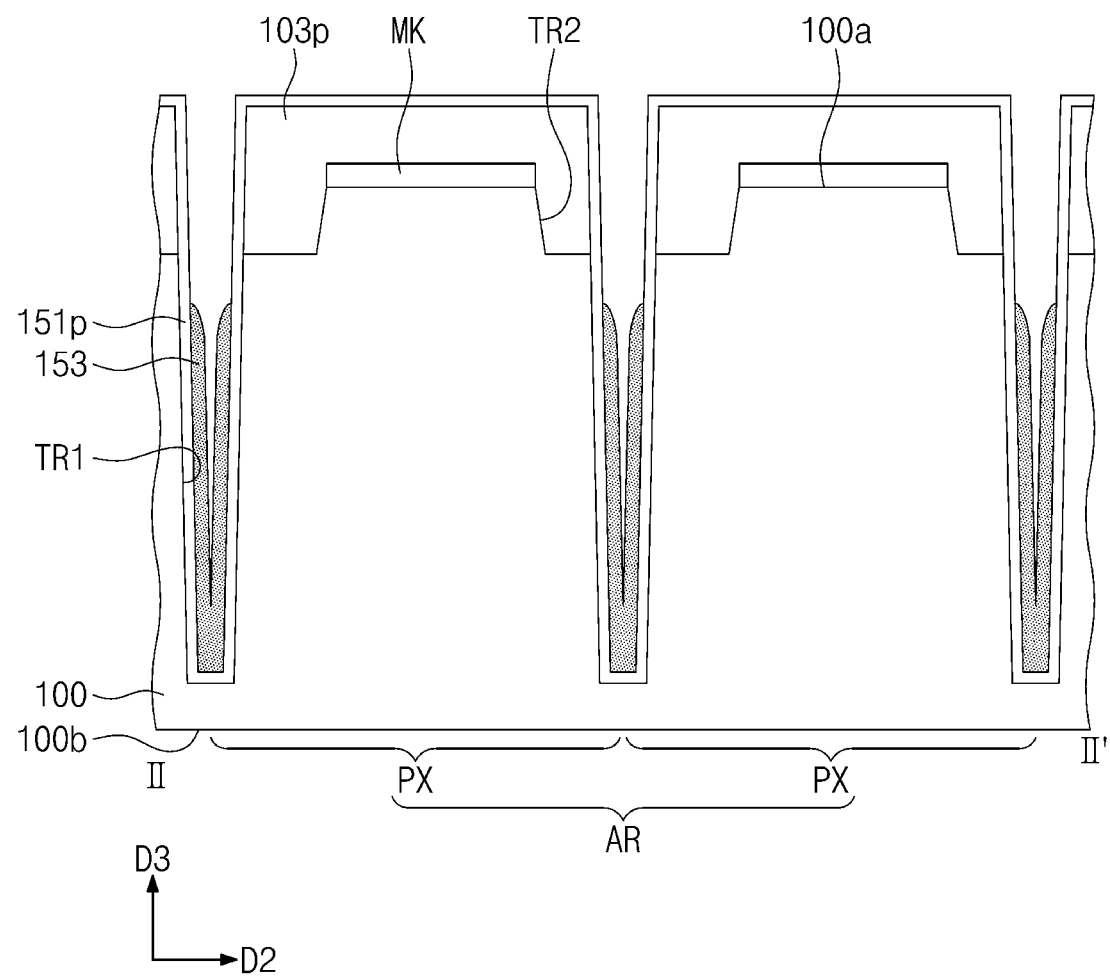

Referring to the embodiments of FIGS. 16 and 17, a first deposition process may be performed to form a first preliminary semiconductor layer 153p on the first preliminary insulating layer 151p. The first preliminary semiconductor layer 153p may be deposited on the first preliminary insulating layer 151p. In an embodiment, the first deposition process may be performed using an impurity-containing source gas, and in this embodiment, the first preliminary semiconductor layer 153p may be doped with the impurity. For example, in an embodiment, the first deposition process may include placing the first substrate 100 in a first chamber and then supplying the source gas into the first chamber. In an embodiment, the source gas may include a first gas containing a silane-based compound and a second gas containing a compound, which is used as the impurity, such as boron. For example, the second gas may contain $BCl_3$ or $B_2H_6$. In this embodiment, the first preliminary semiconductor layer 153p may be formed, as a result of chemical reaction of the first and second gases.

In an embodiment, the first preliminary semiconductor layer 153p may have a uniform impurity concentration, regardless of its vertical position. For example, an impurity concentration of the first preliminary semiconductor layer 153p may have substantially the same value proximate to the first and second surfaces 100a and 100b of the first substrate 100. In this embodiment, if the first semiconductor pattern 153 is formed by a subsequent process of removing an upper portion of the first preliminary semiconductor layer 153p, the first semiconductor pattern 153 may have a uniform impurity concentration regardless of its vertical position. For example, an impurity concentration of the first semiconductor pattern 153 may have substantially the same value proximate to the first and second surfaces 100a and 100b of the first substrate 100.

In another embodiment, the impurity concentration of the first preliminary semiconductor layer 153p may be lower proximate to the second surface 100b of the first substrate 100 than proximate to the first surface 100a of the first substrate 100. In this embodiment, if the first semiconductor pattern 153 is formed by a subsequent process of removing an upper portion of the first preliminary semiconductor layer 153p, there may be a difference in impurity concentration between upper and lower portions of the first semiconductor pattern 153. For example, the impurity concentration of the first semiconductor pattern 153 may be lower proximate to the second surface 100b of the first substrate 100 than proximate to the first surface 100a of the first substrate 100.

Since the deposition process is performed using the source gas including the first and second gases, an additional impurity doping process may not be needed. In this embodiment, the number of process steps in the fabrication process may be reduced, and thus, it may be possible to reduce the process cost and to increase the process efficiency. As shown in the embodiment of FIG. 16, the first preliminary semiconductor layer 153p may cover the first preliminary insulating layer 151p on the inner surface of the first trench TR1 and the top surface of the preliminary device isolation layer 103p. A central portion of the first trench TR1 may not be filled with the preliminary device isolation layer 103p and may form a gap that has a width (e.g., length in the second direction D2) that increases as the distance from the second surface 100b of the first substrate 100 increases. In an embodiment, the first preliminary semiconductor layer 153p may be formed of or include doped poly silicon or doped amorphous silicon. In another embodiment, the first deposition process may be performed such that the first trench TR1 is fully filled with the first preliminary semiconductor layer 153p and no gap is formed.

Referring to the embodiment of FIG. 17, a first etching process may be performed to form the first semiconductor pattern 153. In an embodiment, the first etching process may include supplying an etchant gas into the first chamber. For example, the first etching process may be performed within the same chamber as the chamber for the first deposition process or in an in-situ etching manner. In this embodiment, it may be possible to increase a turnaround time and production efficiency. In an embodiment, the etchant gas may include, for example, chlorine. In this embodiment, an upper portion of the first preliminary semiconductor layer 153p may be removed, and consequently, a portion of the first preliminary insulating layer 151p may be exposed to the outside. A height of the first semiconductor pattern 153 may be controlled by adjusting a process condition of the first etching process. As an example, the first etching process may be performed so that a top surface of the first semiconductor pattern 153 is positioned at a level that is lower than a bottom surface of the preliminary device isolation layer 103p as shown in the embodiment of FIG. 6. In another embodiment, the first etching process may be performed so that the topmost portion of the first semiconductor pattern 153 is positioned at a level that is higher than the bottom surface of the preliminary device isolation layer 103p as shown in the embodiment of FIG. 8. In an embodiment, the first deposition process and the first etching process may be performed several times to adjust the shape of the first semiconductor pattern 153. As an example, the first deposition process and the first etching process may be performed several times to form a bottom portion 153U of the first semiconductor pattern 153 in the shape of the embodiment of FIG. 6. In the image sensor, the smaller the distance to the second surface 100b of the first substrate 100, the more likely that a void may be formed in the first trench TR1. The void may hinder a negative voltage from being uniformly applied to the first semiconductor pattern 153 during the operation of the image sensor. However, in an embodiment in which the bottom portion 153U is formed as shown in the embodiment of FIG. 17, the void may be prevented from being formed in the first trench TR1 and a performance and reliability characteristics of the image sensor may be increased. In certain embodiments, the first deposition process and the first etching process may be independently performed in different chambers. In an embodiment, the first deposition process is performed such that the first trench TR1 is filled with the first preliminary semiconductor layer 153p, the first etching process may be performed to remove only an upper portion of the first preliminary semiconductor layer 153p and to form the first semiconductor pattern 153 filling the first trench TR1. In this embodiment, a process of forming a second semiconductor pattern 155 described with reference to the embodiment of FIG. 18 may be omitted, and a capping pattern 157 may be formed on a top surface of the first semiconductor pattern 153 by a process of the embodiments of FIGS. 19 and 20.

In another embodiment, the first deposition process may be performed without using the impurity-containing second gas, and an additional doping process may be performed to dope the first preliminary semiconductor layer 153p. For example, the first deposition process may be performed to form an undoped layer serving as the first preliminary semiconductor layer 153p. In an embodiment, the first preliminary semiconductor layer 153p may be formed of or include undoped poly silicon or undoped amorphous silicon. Thereafter, a first etching process may be performed on the first preliminary semiconductor layer 153p to form the first semiconductor pattern 153. The first etching process may be performed as the same manner as the process described with reference to the embodiments of FIGS. 16 and 17. After the first etching process, a doping process may be performed on the first semiconductor pattern 153.

In an embodiment, the doping process may be, for example, a beam line ion implantation process, a plasma doping process (PLAD), or a gas phase doping (GPD) process. In an embodiment in which the plasma doping process is performed, a source material in a gaseous state may be supplied into a process chamber. The source material may be ionized to form plasma in the process chamber, and the ionized source materials may be injected into the first semiconductor pattern 153 by applying a high voltage bias to an electrostatic chuck on which the first substrate 100 is loaded. In this embodiment in which the plasma doping process is used for the doping process, an impurity concentration of the first semiconductor pattern 153 may vary depending on its vertical position. For example, an impurity concentration of an upper portion of the first semiconductor pattern 153 may be higher than the impurity concentration of a lower portion of the first semiconductor pattern 153. For example, the impurity concentration of the first semiconductor pattern 153 may be higher proximate to the first surface 100a than at a portion proximate to the second surface 100b. In an embodiment in which the plasma doping process is used, it may be possible to realize a uniform doping to a relatively deep position and to increase a process speed in the doping process, when compared with the embodiment in which the beam line ion implantation process is used.

In an embodiment in which die beam line ion implantation process, it may be difficult to uniformly dope the first semiconductor pattern 153 to a vertical direction due to a relatively large aspect ratio of the first trench TR1. Accordingly, in an embodiment in which the beam line ion implantation process is used as a doping process, an impurity concentration of the first semiconductor pattern 153 may vary depending on its vertical position. For example, the impurity concentration of an upper portion of the first semiconductor pattern 153 may be higher than the impurity concentration of a lower portion of the first semiconductor pattern 153. For example, the impurity concentration of the first semiconductor pattern 153 may be higher proximate to the first surface 100a than at portions proximate to the second surface 100b.

In an embodiment in which the GPD process is performed, an impurity-containing gas may be supplied into a chamber. For example, in an embodiment, the gas may include $BCl_3$ or $B_2H_6$. In an embodiment in which the GPD process is performed, the first semiconductor pattern 153 may be uniformly doped as compared to embodiments in which the beam line ion implantation process or the plasma doping process is performed. For example, in an embodiment in which the GPD process is performed, an impurity concentration of the first semiconductor pattern 153 may have substantially the same value proximate to the first and second surfaces 100a and 100b of the first substrate 100. Thereafter, a thermal treatment process may be performed, and in this embodiment, impurities in the first semiconductor pattern 153 may be diffused into the second semiconductor pattern 155. Accordingly, an impurity concentration of the first semiconductor pattern 153 may be higher than an impurity concentration of the second semiconductor pattern 155.

Figure 18:
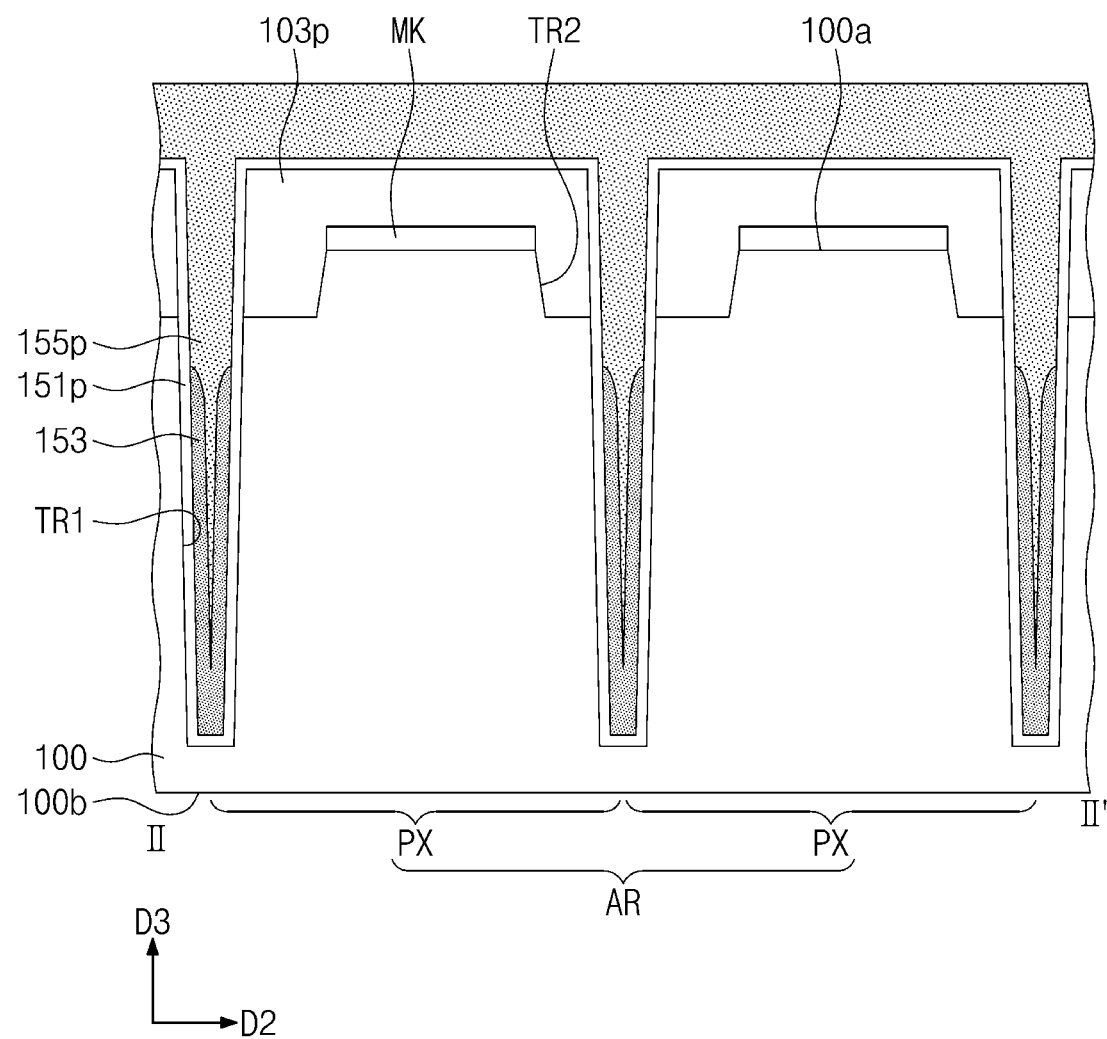

Referring to the embodiment of FIG. 18, a second preliminary semiconductor layer 155p may be formed on the first preliminary insulating layer 151p and the first semiconductor pattern 153. The second preliminary semiconductor layer 155p may be formed to cover the first semiconductor pattern 153 and the first preliminary insulating layer 151p. In an embodiment, the second preliminary semiconductor layer 155p may be formed by a second deposition process. The second preliminary semiconductor layer 155p may be formed to fill the remaining region of the first trench TR1. In an embodiment, the second preliminary semiconductor layer 155p may be formed of or include poly silicon or amorphous silicon.

Figure 19:
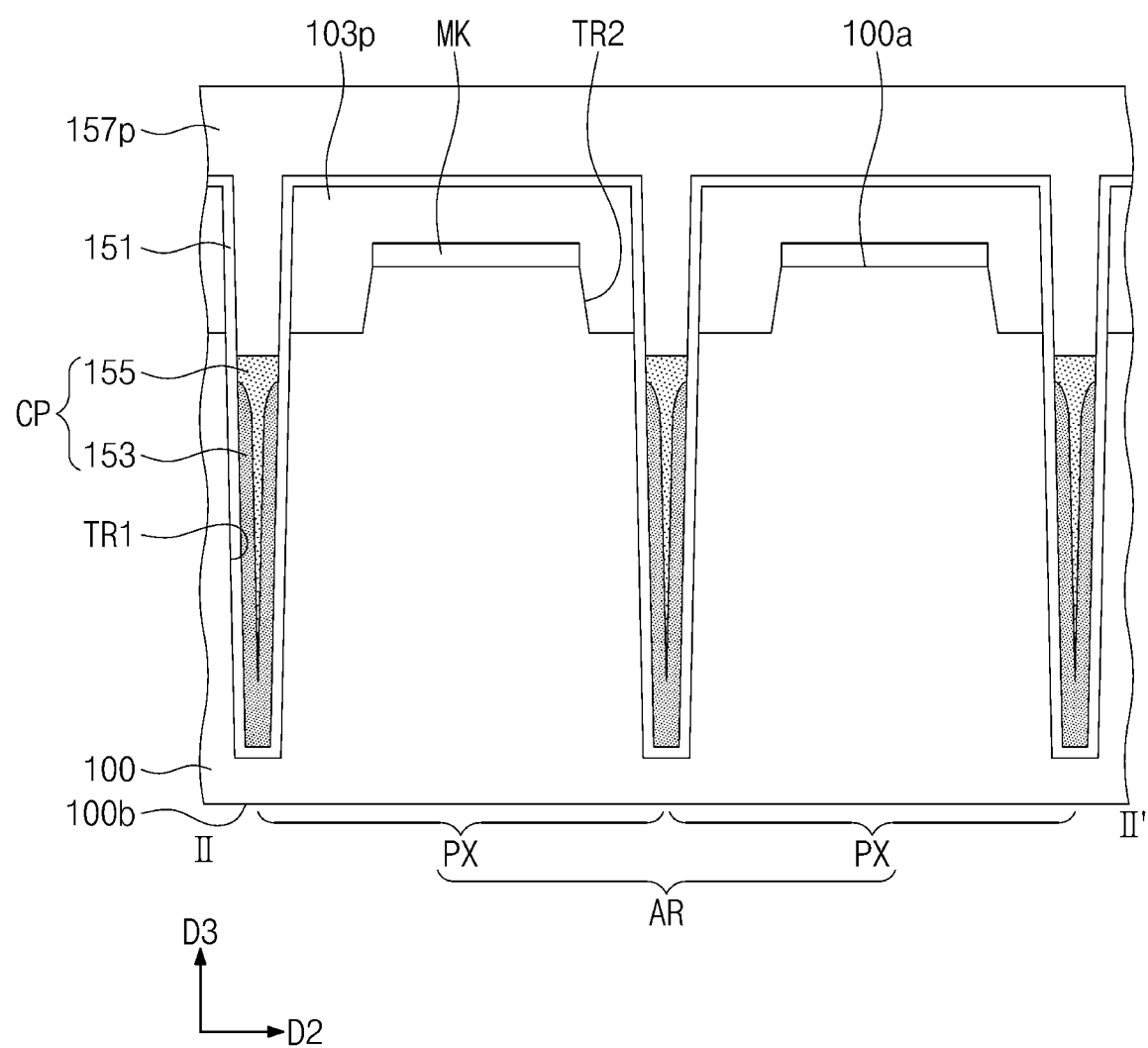

Referring to the embodiment of FIG. 19, a second etching process may be performed on the second preliminary semiconductor layer 155p to form the second semiconductor pattern 155. In an embodiment, the second etching process may be, for example, an anisotropic etching process or an isotropic etching process. The isotropic etching process may be performed using a wet etching solution. For example, in an embodiment in which the second preliminary semiconductor layer 155p includes poly silicon, the second preliminary semiconductor layer 155p may be etched using an etching solution, in which hydrofluoric acid (HF), nitric acid ($HNO_3$), and acetic acid ($CH_3COOH$) are mixed. A preliminary capping pattern 157p may be formed on the first substrate 100 to fill an upper region of the first trench TR1. In an embodiment, the preliminary capping pattern 157p may be formed by a deposition process. In an embodiment, the preliminary capping pattern 157p may be formed of or include at least one compound selected from silicon oxide, silicon nitride, and silicon oxynitride.

Figure 20:
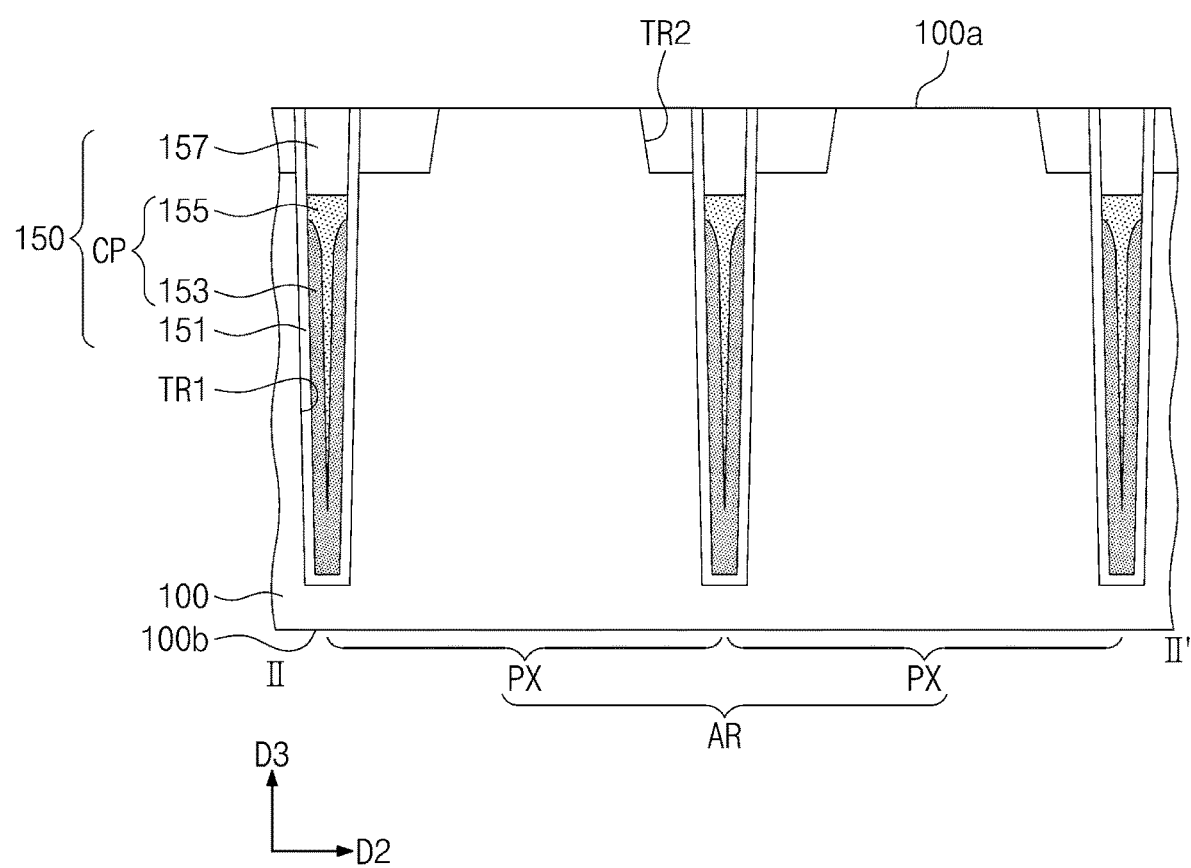

Referring to the embodiment of FIG. 20, a capping pattern 157 and a device isolation pattern 103 may be formed. In an embodiment, the capping pattern 157 and the device isolation pattern 103 may be formed by performing a planarization process on the preliminary capping pattern 157p and the preliminary device isolation layer 103p. In an embodiment, the mask pattern MK may be removed after the planarization process, and in this embodiment, the first surface 100a of the first substrate 100 may be prevented from being damaged.

Figure 21:
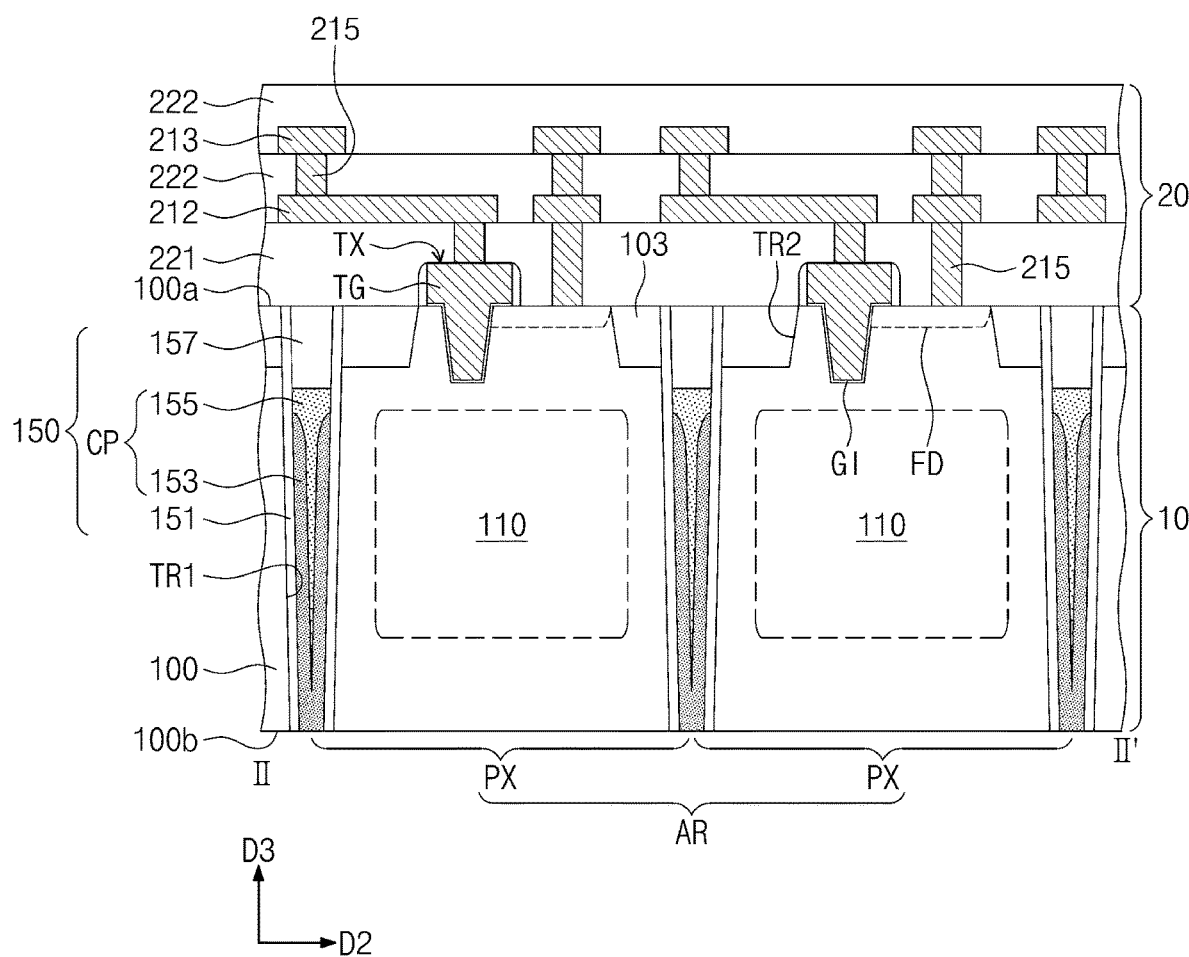

Referring to the embodiment of FIG. 21, a doping process may be performed to form photoelectric conversion regions 110 in unit pixel regions PX, respectively. The photoelectric conversion regions 110 may have a second conductivity type (e.g., n-type), which is different from the first conductivity type (e.g., p-type). A thinning process may be performed to remove a portion of the first substrate 100 or to reduce a vertical thickness of the first substrate 100. In an embodiment, the thinning process may include sequentially performing a grinding or polishing process and an anisotropic or isotropic etching process on the second surface 100b of the first substrate 100. In an embodiment, the first substrate 100 may be inverted when performing the thinning process. A portion of the first substrate 100 may be removed by the grinding or polishing process, and surface defects on the first substrate 100 may be removed by the anisotropic or isotropic etching process.

As a result of the thinning process on the second surface 100b of the first substrate 100, a bottom surface 153b of the first semiconductor pattern 153 may be exposed to the outside. The bottom surface 153b of the first semiconductor pattern 153 may be positioned at substantially the same level as the second surface 100b of the first substrate 100.

Thereafter, a transfer transistor TX may be formed on a first active pattern ACT1 of each of the unit pixel regions PX, a source-follower transistor SX and a selection transistor AX may be formed on a second active pattern ACT2, and a reset transistor RX may be formed on a third active pattern ACT3.

For example, the formation of the transfer transistor TX may include doping the first active pattern ACT1 to form a floating diffusion region FD and forming a transfer gate TG on the first active pattern ACT1. In an embodiment, the formation of the source-follower transistor SX and the selection transistor AX may include doping the second active pattern ACT2 to form impurity regions and forming a source-follower gate SG and a selection gate AG on the second active pattern ACT2. The formation of the reset transistor RX may include doping the third active pattern ACT3 to form impurity regions and forming a reset gate RG on the third active pattern ACT3.

Referring to the embodiment of FIG. 21, a first interconnection insulating layer 221 may be formed on the first surface 100a of the first substrate 100. The first interconnection insulating layer 221 may be formed to cover the transistors TX, RX, SX, and AX, which are formed on the first surface 100a of the first substrate 100.

Second interconnection insulating layers 222 may be sequentially formed on the first interconnection insulating layer 221. First and second interconnection lines 212 and 213 may be formed in each of the second interconnection insulating layers 222.

Referring back to FIG. 5, a back-side insulating layer 132 and first auxiliary insulating layers 134 and 136 may be sequentially formed on the second surface 100b of the first substrate 100. Color filters 303 may be formed on the unit pixel regions PX, respectively. Micro lenses 307 may be formed on the color filters 303, respectively. As a result, the image sensor may be fabricated having the structure of the embodiment of FIG. 5.

According to an embodiment of the present inventive concepts, an image sensor may include a pixel isolation pattern including a first semiconductor pattern and a second semiconductor pattern. Thus, a void may be prevented from being formed in a trench of a substrate and the image sensor may have increased performance and reliability.

While example embodiments of the present inventive concepts have been particularly shown and described, it will be understood by one of ordinary skill in the art that variations in form and detail may be made therein without departing from the spirit and scope of the attached claims.

What is claimed is:

1. An image sensor, comprising:
a substrate having a first surface and a second surface that are opposite to each other, the substrate including unit pixel regions having photoelectric conversion regions;
a semiconductor pattern disposed in a first trench defined in the substrate, the semiconductor pattern configured to define the unit pixel regions of the substrate, the semiconductor pattern includes a first semiconductor pattern and a second semiconductor pattern physically contacting the first semiconductor pattern, the second semiconductor pattern physically contacting inner side surfaces of a side portion of the first semiconductor pattern; and
a back-side insulating layer covering the second surface of the substrate,
wherein the first semiconductor pattern comprises:
the side portion extended along an inner side surface of the first trench; and
a bottom portion connected to the side portion and disposed to be closer to the second surface of the substrate than the side portion, and
the second semiconductor pattern extends toward the second surface of the substrate and is vertically spaced apart from the backside insulating layer with the bottom portion of the first semiconductor pattern interposed between a lowermost surface of the second semiconductor pattern that is closest to the second surface of the substrate and the back-side insulating layer.

2. The image sensor of claim 1, wherein a bottom surface of the bottom portion of the first semiconductor pattern is positioned at a same level as a level of the second surface of the substrate.

3. The image sensor of claim 1, wherein:
each of the first and second semiconductor patterns includes poly silicon containing an impurity; and
a concentration of the impurity of the first semiconductor pattern is higher than a concentration of the impurity of the second semiconductor pattern.

4. The image sensor of claim 1, wherein:
the first semiconductor pattern includes poly silicon containing an impurity; and
a concentration of the impurity of the first semiconductor pattern proximate to the second surface of the first substrate is equal to a concentration of the impurity proximate to the first surface of the first substrate.

5. The image sensor of claim 1, further comprising:
a device isolation pattern that is disposed adjacent to the first surface and fills a second trench of the substrate,
wherein a bottom surface of the device isolation pattern is disposed at a level between a topmost portion of the first semiconductor pattern and the first surface of the substrate.

6. The image sensor of claim 1, further comprising:
a device isolation pattern that is disposed adjacent to the first surface and fills a second trench of the substrate,
wherein a topmost portion of the first semiconductor pattern is disposed at a level between a bottom surface of the device isolation pattern and the first surface of the substrate.

7. The image sensor of claim 1, wherein a distance between the second semiconductor pattern and the second surface of the substrate is in a range of 0.1 μm to 2.5 μm.

8. The image sensor of claim 1, wherein:
the second semiconductor pattern comprises a first portion and a second portion;
the second portion is enclosed by the side portion of the first semiconductor pattern and extends towards the second surface of the substrate;
the first portion is disposed on and connected to the second portion; and
a lowermost portion of the second portion is positioned at a level higher than the second surface of the substrate.

9. The image sensor of claim 8, wherein a width of the first portion of the second semiconductor pattern is larger than a width of the second portion of the second semiconductor pattern.

10. The image sensor of claim 1, wherein:
the side portion of the first semiconductor pattern has a first inner side surface and a second inner side surface that are opposite to each other; and
a distance between the first and second inner side surfaces decreases with decreasing distance to the second surface of the substrate.

11. The image sensor of claim 1, further comprising:
a first insulating layer disposed between the semiconductor pattern and the inner side surface of the first trench, the first insulating layer covers the inner side surface of the first trench,
wherein the second semiconductor pattern is spaced apart from the substrate with the first insulating layer interposed therebetween.

12. The image sensor of claim 1, wherein:
the side portion of the first semiconductor pattern has a first inner side surface and a second inner side surface that are opposite to each other; and
the second semiconductor pattern extends vertically and fills a region between the first inner side surface and the second inner side surface.

13. An image sensor, comprising:
a substrate having a first surface and a second surface that are opposite to each other, the substrate including unit pixel regions having photoelectric conversion regions;
a device isolation pattern that is disposed adjacent to the first surface of the substrate;
a pixel isolation pattern configured to define the unit pixel regions, the pixel isolation pattern penetrating the device isolation pattern and filling a first trench of the substrate; and
a back-side insulating layer covering the second surface of the substrate,
wherein the pixel isolation pattern comprises a first insulating layer covering an inner surface of the first trench, a first semiconductor pattern, and a second semiconductor pattern physically contacting inner side surfaces of the first semiconductor pattern, the second semiconductor pattern penetrating the first semiconductor pattern and directly contacting the back-side insulating layer,
the first semiconductor pattern and the second semiconductor pattern include poly silicon containing an impurity, wherein a width of the second semiconductor pattern decreases as a distance to the second surface of the substrate decreases.

14. The image sensor of claim 13, wherein a concentration of the impurity of the first semiconductor pattern is higher than a concentration of the impurity of the second semiconductor pattern.

15. The image sensor of claim 13, further comprising a first insulating layer interposed between the first semiconductor pattern and the substrate,
wherein a bottom surface of the first insulating layer, a bottom surface of the first semiconductor pattern, a bottom surface of the second semiconductor pattern, and the second surface of the substrate are coplanar with each other.

16. The image sensor of claim 13, further comprising:
a capping pattern covering a top surface of the second semiconductor pattern,
wherein a ratio of a distance from the top surface of the second semiconductor pattern to a topmost portion of the first semiconductor pattern to a height of the capping pattern is in a range of 0.1 to 0.6.

17. The image sensor of claim 13, further comprising:
a capping pattern disposed on the second semiconductor pattern,
wherein the first semiconductor pattern has a first inner side surface and a second inner side surface that are opposite to each other, and
the capping pattern extends into a region between the first inner side surface and the second inner side surface and directly contacts a top surface of the second semiconductor pattern.

18. The image sensor of claim 13, wherein a topmost portion of the first semiconductor pattern is positioned at a level between a bottom surface of the device isolation pattern and the first surface of the substrate.

19. An image sensor, comprising:
a substrate having a first surface and a second surface that are opposite to each other, the substrate including a pixel array region, an optical black region, and a pad region, the pixel array region including unit pixel regions having photoelectric conversion regions;
a pixel isolation pattern and a device isolation pattern disposed in the substrate, the pixel isolation pattern including a first insulating layer, a first semiconductor pattern, a second semiconductor pattern physically contacting the first semiconductor pattern and physically contacting inner side surfaces of the first semiconductor pattern, and a capping pattern;
an interconnection layer disposed on the first surface of the substrate, the interconnection layer including insulating layers covering the first surface of the substrate and interconnection lines disposed in the insulating layers;

transistors disposed on the first surface of the substrate;

a back-side insulating layer covering the second surface of the substrate and a bottom surface of the pixel isolation pattern;

color filters and micro lenses disposed on a lower insulating layer;

a grid pattern disposed on the second surface of the substrate; and pad terminals disposed on the pad region, wherein the second semiconductor pattern is spaced apart from the back-side insulating layer with the first semiconductor pattern interposed between a lowermost surface of the second semiconductor pattern that is closest to the second surface of the substrate and the back-side insulating layer.

20. The image sensor of claim 19, wherein:

the semiconductor pattern includes poly silicon containing an impurity;

the interconnection lines include at least one of copper and tungsten.

\* \* \* \* \*